US011527660B2

(12) United States Patent
Hoshi

(10) Patent No.: US 11,527,660 B2
(45) Date of Patent: Dec. 13, 2022

(54) SEMICONDUCTOR DEVICE WITH A LIFETIME KILLER REGION IN THE SUBSTRATE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/137,643

(22) Filed: Dec. 30, 2020

(65) Prior Publication Data

US 2021/0273117 A1 Sep. 2, 2021

(30) Foreign Application Priority Data

Feb. 28, 2020 (JP) .............................. JP2020-034359

(51) Int. Cl.
*H01L 29/808* (2006.01)
*H01L 29/06* (2006.01)

(52) U.S. Cl.
CPC ........ *H01L 29/808* (2013.01); *H01L 29/0619* (2013.01)

(58) Field of Classification Search
CPC . H01L 29/808; H01L 29/0619; H01L 21/046; H01L 29/0661; H01L 29/0878; H01L 29/1095; H01L 29/0623; H01L 29/167; H01L 29/32; H01L 29/6606; H01L 29/66068; H01L 29/66734; H01L 29/7804; H01L 29/7811; H01L 29/7813;

(Continued)

(56) References Cited

U.S. PATENT DOCUMENTS

2006/0278925 A1 12/2006 Yamaguchi
2017/0263603 A1* 9/2017 Hata ................... H01L 27/0727

(Continued)

FOREIGN PATENT DOCUMENTS

JP H06-21358 A 1/1994
JP 2006-332127 A 12/2006
JP 2019-080035 A 5/2019

*Primary Examiner* — Wasiul Haider
(74) *Attorney, Agent, or Firm* — Rabin & Berdo, P.C.

(57) ABSTRACT

A semiconductor device having, in a plan view thereof, an active region and a termination region that surrounds a periphery of the active region. The device includes a semiconductor substrate containing a wide bandgap semiconductor, a first-conductivity-type region provided in the semiconductor substrate, spanning from the active region to the termination region, a plurality of second-conductivity-type regions provided between the first-conductivity-type region and the first main surface of the semiconductor substrate in the active region, a first electrode provided on a first main surface of the semiconductor substrate and electrically connected to the second-conductivity-type regions, a second electrode provided on the second main surface of the semiconductor substrate and electrically connected to the first-conductivity-type region, and a lifetime killer region provided in the first-conductivity-type region and spanning from the active region to the termination region. In the active region, pn junctions between the first-conductivity-type region and the second-conductivity-type regions form a vertical semiconductor device element.

7 Claims, 15 Drawing Sheets

(58) Field of Classification Search
CPC ............... H01L 29/7815; H01L 29/872; H01L 29/0638; H01L 29/16; H01L 29/1608; H01L 29/861
See application file for complete search history.

(56) References Cited

U.S. PATENT DOCUMENTS

| | | | |
|---|---|---|---|
| 2018/0374918 A1* | 12/2018 | Nishio | ................... H01L 29/32 |
| 2019/0259842 A1* | 8/2019 | Basler | ................ H01L 29/0603 |
| 2019/0305140 A1* | 10/2019 | Morimoto | ........... H01L 29/0696 |
| 2020/0144370 A1* | 5/2020 | Grasse | ................. H01L 21/046 |

* cited by examiner

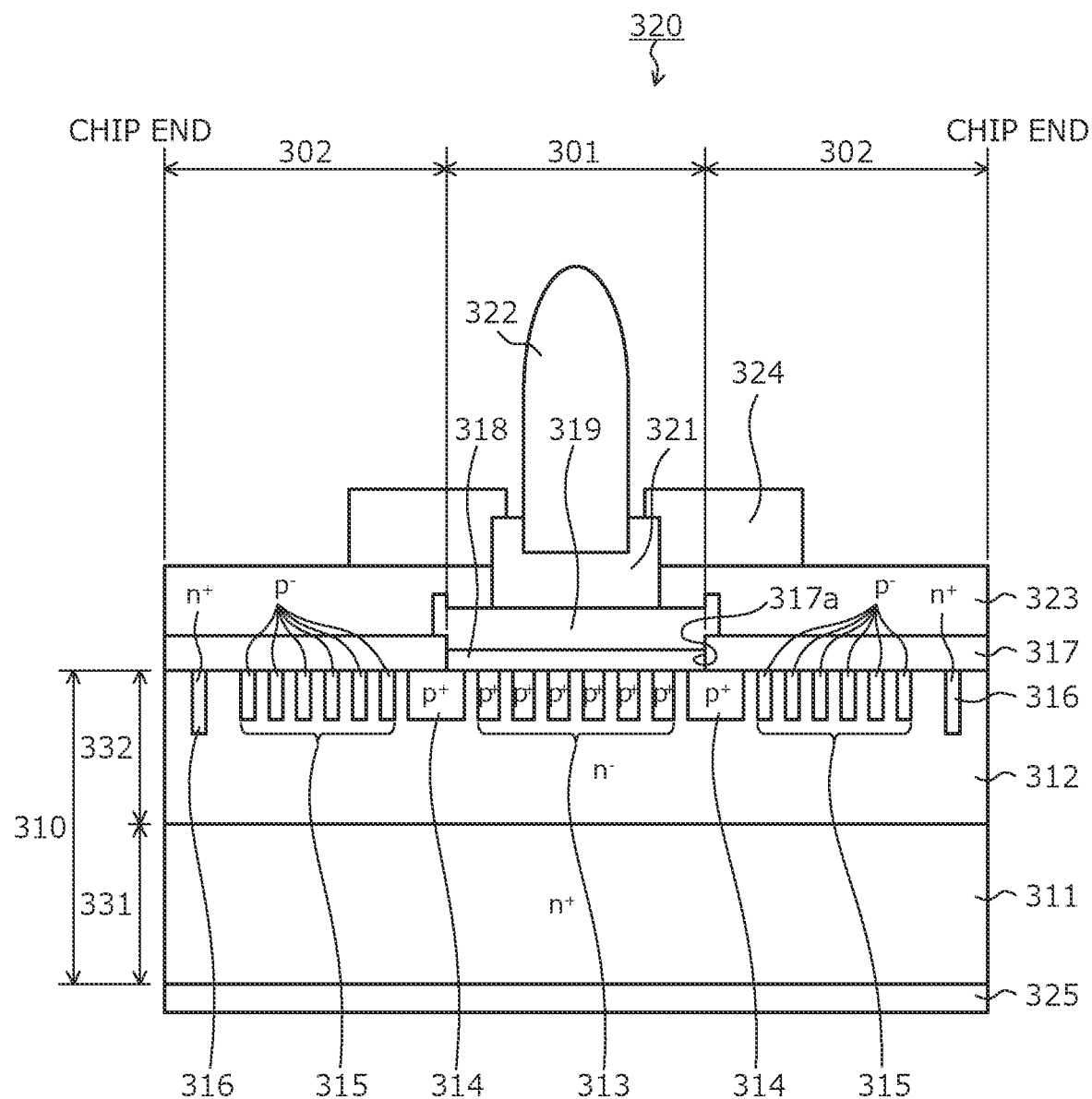

SEMICONDUCTOR DEVICE WITH A LIFETIME KILLER REGION IN THE SUBSTRATE

CROSS REFERENCE TO RELATED APPLICATIONS

This application is based upon and claims the benefit of priority of the prior Japanese Patent Application No. 2020-034359, filed on Feb. 28, 2020, the entire contents of which are incorporated herein by reference.

BACKGROUND OF THE INVENTION

1. Field of the Invention

Embodiments of the invention relate to a semiconductor device.

2. Description of the Related Art

Conventionally, power semiconductor devices that control high voltage and/or large current, for example, include several types such as bipolar transistors, insulated gate bipolar transistors (IGBTs), and metal oxide semiconductor field effect transistors (MOSFETs) that have insulated gates having a three-layered structure including a metal, an oxide film and a semiconductor; these devices are selectively used according to an intended purpose.

For example, bipolar transistors and IGBTs have high current density compared to MOSFETs and can be adapted for large current but cannot be switched at high speeds. In particular, use is limited to a switching frequency about several kHz for bipolar transistors and about several tens of kHz for IGBTs. On the other hand, power MOSFETs have low current density compared to bipolar transistors and IGBTs and are difficult to adapt for large current but enable high-speed switching operation of up to several MHz.

Further, due to the structure of a MOSFET, a parasitic diode formed by a pn junction between a p-type base region and an $n^-$-type drift region is built into in the MOSFET. Therefore, the parasitic diode of a MOSFET used as a device for inverters may be used as a freewheeling diode (FWD) for protecting the MOSFET. A power semiconductor device is a semiconductor device for power control, controls high voltage and/or large current, and performs power conversion (conversion of a physical quantity such voltage, current, frequency, etc. to another physical quantity), rectification, etc.

Silicon (Si) is used as a constituent material of power semiconductor devices. There is a strong demand in the market for large-current, high-speed power semiconductor devices, thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has gained attention as a semiconductor material enabling fabrication (manufacture) of a next-generation power semiconductor device having low ON voltage, high-speed characteristics, and high-temperature characteristics.

Silicon carbide is a very stable material chemically, has a wide bandgap of 3 eV, and can be used very stably as a semiconductor material even at high temperatures. Further, silicon carbide has a critical electric field strength that is at least ten times that of silicon and therefore, is expected to be a semiconductor material capable of sufficiently reducing ON resistance. Such characteristics of silicon carbide are not limited to silicon carbide, all semiconductors having a bandgap wider than that of silicon (hereinafter, wide bandgap semiconductor) similarly have such characteristics.

Further, accompanying increased current, in a MOSFET, a trench gate structure in which a channel is formed along sidewalls of a trench gate, in a direction orthogonal to the front surface of a semiconductor chip, is advantageous as compared to a planar gate structure in which a channel (inversion layer) is formed along a front surface of the semiconductor chip. A reason for this is that a trench gate structure enables increase of the unit cell (constituent unit of an element) density per unit area, thereby enabling the current density per unit area to be increased.

A rate of temperature rise relative to a volume occupied by the unit cells increases by an extent to which device current density is increased and therefore, to enhance discharge efficiency and stabilize reliability, a double-sided cooling structure is necessary. Further, a power semiconductor device in which on a single semiconductor substrate (semiconductor chip) having a main semiconductor element that performs a main operation of the power semiconductor device, a high-function structure having high-function portions such as a current sensing portion, a temperature sensing portion, and an the overcurrent protecting portion are disposed as circuit portions for protecting and controlling the main semiconductor element is provided has been proposed.

Further, a Schottky barrier diode (SBD) having rectification characteristics due to a Schottky contact between the semiconductor substrate and a metal conductive layer or the like deposited on the semiconductor substrate can be fabricated in a semiconductor substrate in which a wide bandgap semiconductor is used as a semiconductor material, similarly to a semiconductor substrate in which silicon is used as a semiconductor material. Accordingly, a high-voltage SBD having a low ON resistance and using a wide bandgap semiconductor as a material of the semiconductor substrate can be realized.

For example, a SBD in which silicon carbide is used as a semiconductor material (hereinafter, SiC-SBD) is a unipolar device that may reduce reverse recovery loss as compared to a pn junction diode in which silicon is used as a semiconductor material. Therefore, in a module in which a semiconductor substrate having an IGBT fabricated therein is integrated (hereinafter, IGBT chip), a hybrid system is applied in which the IGBT chip containing silicon as a semiconductor material and a semiconductor substrate in which a SiC-SBD used as a FWD for protecting the IGBT is fabricated are integrated.

As a structure of a conventional semiconductor device, a MOSFET in which silicon carbide is used as a semiconductor material (hereinafter, SiC-MOSFET) is described. FIG. 19 is a cross-sectional view of the structure of the conventional semiconductor device. A conventional silicon carbide semiconductor device 220 depicted in FIG. 19 is a vertical SiC-MOSFET having a trench gate structure in an active region 201 of a semiconductor substrate (semiconductor chip) 210 that contains silicon carbide and the conventional silicon carbide semiconductor device 220 has a voltage withstanding structure in an edge termination region 202 that surrounds a periphery of the active region 201.

The semiconductor substrate 210 is formed by sequentially forming an $n^-$-type silicon carbide layer 272 and a p-type silicon carbide layer 273 on an $n^+$-type starting substrate 271 by epitaxial growth. A front surface of the semiconductor substrate 210, bordered by a drop 274 formed by removing a portion of the p-type silicon carbide layer 273 in the edge termination region 202, has a chip-end portion (hereinafter, second face) 210b that is closer to ends of the semiconductor substrate 210 than is a chip-center (center of the semiconductor substrate 210) portion (hereinafter, first face) 210a thereof and that is recessed to be closer to a drain electrode 251 than is the first face 210a.

Due to the drop 274, the p-type silicon carbide layer 273 is left on a front side of the semiconductor substrate 210 in a mesa shape. The n$^-$-type silicon carbide layer 272 and the p-type silicon carbide layer 273 respectively form an n$^-$-type drift region 232 and p-type base regions 234. In surface regions of the semiconductor substrate 210 at the second face 210b of the front surface, a JTE structure 293 is configured by p$^-$-type regions 291 and p$^-$-type regions 292 selectively provided in the n$^-$-type silicon carbide layer 272.

Reference numeral 203 is an intermediate region between the active region 201 and the edge termination region 202. Reference numeral 221 is a source pad. Reference numeral 231 is an n$^+$-type drain region formed by the n$^+$-type starting substrate 271. Reference numerals 233, 235, 236, 237, 238, 239, 252, 253, and 294 respectively are n-type current spreading regions, n$^+$-type source regions, p$^{++}$-type contact regions, gate trenches, gate insulating films, gate electrodes, a field oxide film, a passivation film, and an n$^+$-type channel stopper region.

Reference numeral 241 is a metal film in ohmic contact with the semiconductor substrate. Reference numerals 242, 243 244, and 245 are barrier metals 246. Reference numerals 247 and 248 are a plating film and a terminal, respectively. Reference numerals 249 and 250 are protective films. Reference numerals 261, 262, and 283 are p$^+$-type regions. Reference numerals 284 and 285 respectively are a p-type base region and a p$^{++}$-type contact region. Reference character 210c is a third face (mesa edge of the drop) of the front surface of the semiconductor substrate 210. Reference numerals 281 and 282 are gate wiring layers configuring a gate runner 280.

As another example of the structure of a conventional semiconductor device, a SiC-SBD is described. FIG. 20 is a cross-sectional view of another example a structure of a conventional semiconductor device. A conventional silicon carbide semiconductor device 320 depicted in FIG. 20 is a diode having a junction barrier Schottky (JBS) structure in an active region 301 of a semiconductor substrate (semiconductor chip) 310 containing silicon carbide and includes a voltage withstanding structure in an edge termination region 302 surrounding a periphery of the active region 301.

The semiconductor substrate 310 is formed by epitaxially growing an n$^-$-type silicon carbide layer 332 forming an n$^-$-type drift region 312, on an n$^+$-type starting substrate 331 forming an n$^+$-type cathode region 311. In the active region 301, in surface regions of the semiconductor substrate 310 at a front surface thereof, p$^+$-type regions 313 forming the JBS structure are selectively provided in the n$^-$-type silicon carbide layer 332. Near a border between the active region 301 and the edge termination region 302, a p$^+$-type region 314 surrounding a periphery of the active region 301 is selectively provided separate from the p$^+$-type regions 313.

In the edge termination region 302, in surface regions of the semiconductor substrate 310 at the front surface thereof, p$^-$-type regions 315 and an n$^+$-type channel stopper region 316 are selectively provided in the n$^-$-type silicon carbide layer 332. The p$^-$-type regions 315 are provided separate from the p$^+$-type region 314. The p$^-$-type regions 315 surround a periphery of the p$^+$-type region 314 in concentric circles centered around the active region 301 in a plan view thereof and form field limiting rings (FLRs).

The n$^+$-type channel stopper region 316 is provided separate from the p$^-$-type regions 315, closer to the chip ends than are the p$^-$-type regions 315. Reference characters 317, 317a, 319, 321, 322, and 325 are respectively an interlayer insulating film, a contact hole, an anode pad, a plating film, a terminal pin, and a cathode electrode. Reference numeral 318 is a metal electrode (hereinafter, Schottky electrode) in Schottky contact with the n$^-$-type drift region 312 and functions as an anode electrode. Reference numerals 323 and 324 are protective films.

As a conventional power semiconductor device, a device has been proposed that improves turn-off characteristics by providing, in an n$^-$-type drift region, a lifetime killer region in which a lifetime of minority carriers (holes) is shortened by introducing therein recombination centers that trap positive holes (holes) (for example, refer to Japanese Laid-Open Patent Publication No. 2006-332127). In Japanese Laid-Open Patent Publication No. 2006-332127, the lifetime killer region having a uniform thickness in a direction parallel to a main surface of the semiconductor substrate, spanning between chip edges, is provided at a depth so as not to be in contact with an n-type drift region above an n$^-$-type drift region and not to be in contact with an n$^+$-type region beneath the n$^-$-type drift region.

As a conventional power semiconductor device, a vertical MOSFET has been proposed in which a lifetime killer region in which a lifetime of minority carriers (holes) is shortened is provided in an entire area of an n$^-$-type drift region, in an active region (for example, refer to Japanese Laid-Open Patent Publication No. 2019-080035). In Japanese Laid-Open Patent Publication No. 2019-080035, when the vertical MOSFET is used as a device for an inverter, during turn-off of the MOSFET, even when a large current passes through a parasitic diode of the MOSFET, holes in the n$^-$-type drift region are suppressed from reaching an n$^+$-type drain region.

As a conventional power semiconductor device, a vertical IGBT has been proposed in which a lifetime killer region in which a lifetime of minority carriers (holes) is shortened is provided in an entire area of an n$^-$-type drift region, in an edge termination region (for example, refer to Japanese Laid-Open Patent Publication No. H6-021358). In Japanese Laid-Open Patent Publication No. H6-021358, an amount of positive holes injected from an emitter region (p$^+$-type collector region of the IGBT) of a parasitic bipolar transistor formed in the edge termination region, through the n$^-$-type drift region and into to a collector region (n$^+$-type emitter region of the IGBT) decreases and a withstand voltage of the edge termination region is enhanced.

SUMMARY OF THE INVENTION

According to an embodiment of the invention, a semiconductor device having, in a plan view thereof, an active region and a termination region that surrounds a periphery of the active region, the device includes: a semiconductor substrate containing a wide bandgap semiconductor having a bandgap wider than that of silicon, the semiconductor substrate having a first main surface and a second main surface opposite to each other; a first-conductivity-type region provided in the semiconductor substrate, spanning from the active region to the termination region; a plurality of second-conductivity-type regions provided in the semiconductor substrate, between the first-conductivity-type region and the first main surface of the semiconductor substrate and in the active region; a first electrode provided on the first main surface of the semiconductor substrate and electrically connected to the second-conductivity-type regions; a second electrode provided on the second main surface of the semiconductor substrate and electrically connected to the first-conductivity-type region; and a lifetime killer region in which a lifetime of minority carriers is shortened, the lifetime killer region being provided in the first-conductivity-type region and spanning from the active region to the termination region. In the active region the first-conductivity-type region and the second-conductivity-type regions form a plurality of pn junctions therebetween, to thereby form a vertical semiconductor device element, current passing through the vertical semiconductor device element in a direction from the first main surface of the semiconductor substrate toward the second main surface thereof or in a direction from the second main surface of the semiconductor substrate toward the first main surface thereof, and the first electrode and the second electrode respectively form a first electrode and a second electrode of the vertical semiconductor device element.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 20 is a cross-sectional view of another example a structure of a conventional semiconductor device.

DETAILED DESCRIPTION OF THE INVENTION

Figure 1:
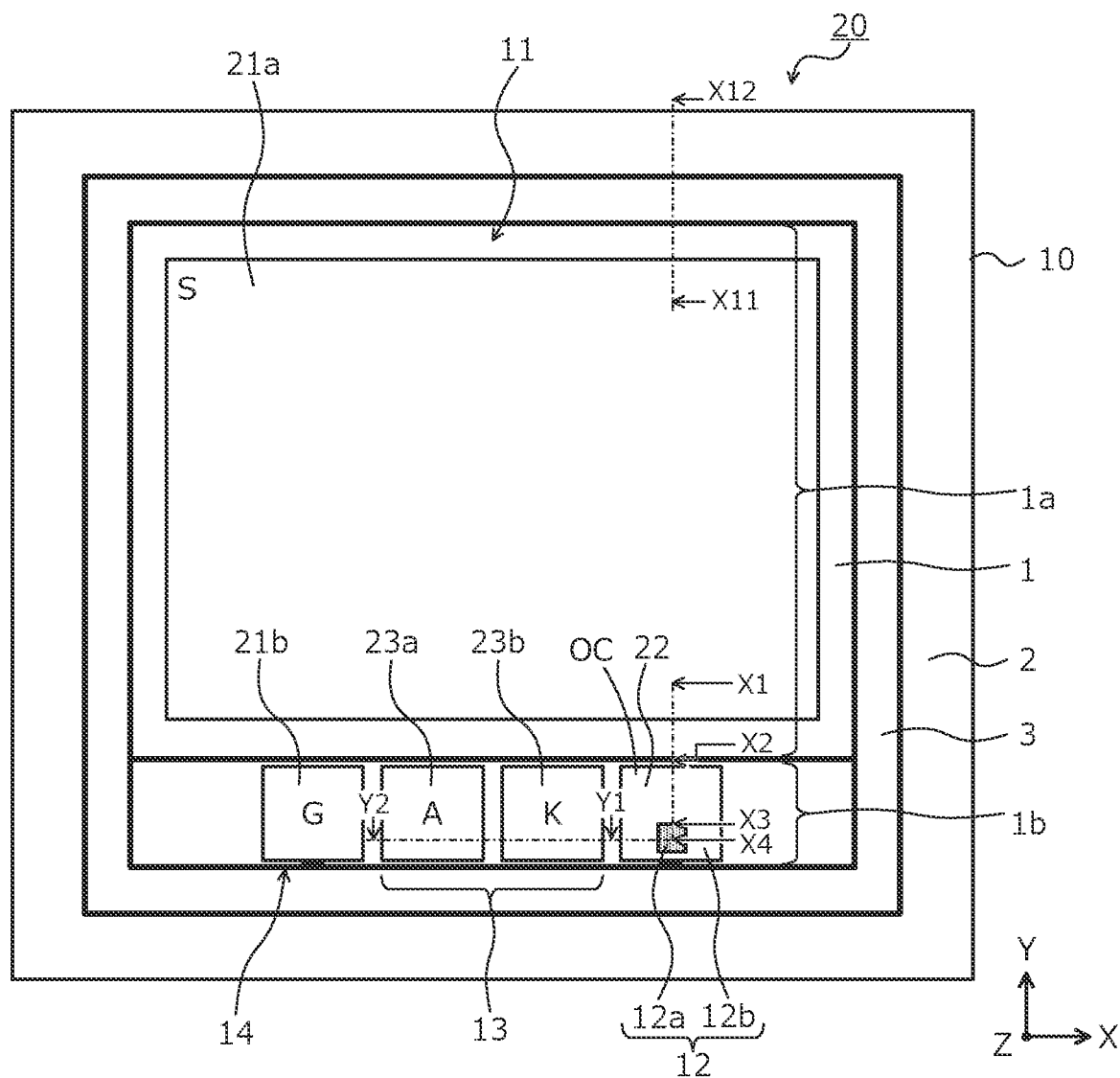
FIG. 1 is a plan view of a layout of a semiconductor device according to a first embodiment when viewed from a front side of a semiconductor substrate.

First, problems associated with the conventional techniques are discussed. Conventionally, while rays of extremely small particles such as protons and heavy particles flying around (cosmic rays) in outer space (space beyond the earth's atmosphere) are known to greatly affect adversely semiconductor devices used in outer space, recently, semiconductor devices used in the earth's atmosphere have also been found to be adversely affected. When cosmic rays enter the earth's atmosphere, due to collisions between the cosmic rays and elements of the earth's atmosphere, rays of numerous secondary particles such as protons, neutrons, mesons, etc. (secondary cosmic rays) occur.

Of these numerous secondary particles, in particular, neutrons (hereinafter, secondary cosmic ray neutrons), which carry no charge, are slowed down only by collisions with atomic nuclei of elements of the earth's atmosphere. Therefore, about ten (10) secondary cosmic ray neutrons/$cm^2$ per hour (1 hour) reach the surface of the earth with high energy of at least 10 MeV. These high-energy secondary cosmic ray neutrons, when entering a semiconductor, which is a constituent material of electronic devices, cause nuclear reactions with elements in the semiconductor, at a predetermined ratio.

When these nuclear reactions occur in the semiconductor substrate, in a region thereof (hereinafter, device region) in which a semiconductor device element that configures a semiconductor device such as a semiconductor memory thereof for a complementary MOS (CMOS) structure, a device region thereof for a semiconductor device element such as a MOSFET, IGBT, diode, etc. configuring a power semiconductor device, or near these device regions, charge induced by these nuclear reactions cause degradation and/or destruction of the semiconductor device element.

Recently, in particular, the reliability of semiconductor devices has increased and failure rates have decreased, whereby destruction due to secondary cosmic rays has become remarkable even in semiconductor devices used in the earth's atmosphere. Furthermore, due to size reductions of semiconductor devices, neutrons and elements in the semiconductor react and generated a rays cause increases in gate insulation destruction, avalanche destruction, destruction due to parasitic bipolar transistor operation, destruction due to parasitic thyristors.

Power semiconductor device units applied and combined as components of a power semiconductor device used in the earth's atmosphere also are used as constituent components of vehicles for transportation from the earth to outer space and the frequency of this use is increasing. Therefore, even for power semiconductor devices used in the earth's atmosphere, it is desirable for resistance against destruction due to cosmic rays, secondary cosmic rays, etc. (hereinafter, cosmic ray destruction resistance) to be enhanced.

Embodiments of a semiconductor device according to the present invention is described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A semiconductor device according to a first embodiment contains a semiconductor having a bandgap wider than that of silicon (Si) (wide bandgap semiconductor) as a semiconductor material. A structure of the semiconductor device according to the first embodiment is described taking, as an example, an instance in which, for example, silicon carbide (SiC) is used as a wide bandgap semiconductor. FIG. 1 is a plan view of a layout of the semiconductor device according to the first embodiment when viewed from a front side of a semiconductor substrate.

A semiconductor device 20 according to the first embodiment and depicted in FIG. 1 has a main semiconductor device element 11 (vertical semiconductor device element) and at least one circuit portion for protecting and controlling the main semiconductor device element 11, in an active region 1 of a single semiconductor substrate (semiconductor chip) 10 containing silicon carbide. The active region 1 is provided in substantially a center (chip center) of the semiconductor substrate 10. The main semiconductor device element 11 is a vertical MOSFET that performs a main operation of the semiconductor device 20 and is configured by multiple unit cells (functional units of a device element) connected in parallel to one another by a source pad (first electrode) 21a described hereinafter.

The main semiconductor device element 11 is disposed in an effective region (hereinafter, main effective region) 1a of the active region 1. The main effective region 1a is a region through which a main current (drift current) of the main semiconductor device element 11 passes in a direction from a back surface of the semiconductor substrate 10 to a front surface thereof (a direction opposite to a depth direction Z), when the main semiconductor device element 11 is ON. The main effective region 1a, for example, has a substantially rectangular shape in a plan view thereof and occupies a majority of a surface area of the active region 1. Three edges of the substantially rectangular shape of the main effective region 1a in a plan view thereof are adjacent to an intermediate region 3 described hereinafter.

The circuit portion for protecting and controlling the main semiconductor device element 11, for example, is a high-function portion such as a current sensing portion 12, a temperature sensing portion 13, an overcurrent protecting portion (not depicted), an arithmetic circuit portion (not depicted), etc. disposed in a main non-operating region 1b of the active region 1. The main non-operating region 1b is a region free of unit cells of the main semiconductor device element 11 and does not function as the main semiconductor device element 11. The main non-operating region 1b, for example, has a substantially rectangular shape in a plan view thereof and is disposed between a remaining one edge of the substantially rectangular shape of the main effective region 1a in a plan view thereof and the intermediate region 3.

The intermediate region 3 between the active region 1 and an edge termination region 2 is adjacent to the active region 1 and surrounds a periphery of the active region 1. A border between the intermediate region 3 and the edge termination region 2, for example, is a border between a first face 10a and a third face 10c described hereinafter. The edge termination region 2 is a region between the intermediate region 3 and ends of the semiconductor substrate 10, surrounds a periphery of the active region 1 with the intermediate region 3 intervening therebetween, mitigates electric field at a front side of the semiconductor substrate 10, and sustains a breakdown voltage. The breakdown voltage is a voltage limit at which erroneous operation or destruction of the semiconductor device does not occur.

A source pad (electrode pad) 21a of the main semiconductor device element 11 is disposed in the main effective region 1a, on the front surface of the semiconductor substrate 10. The main semiconductor device element 11 has a large current capacity as compared to other circuit portions. Therefore, the source pad 21a of the main semiconductor device element 11 has substantially a same shape as that of the main effective region 1a in a plan view thereof and covers substantially an entire area of the main effective region 1a. The source pad 21a of the main semiconductor device element 11 is disposed separate from other electrode pads excluding the source pad 21a.

The other electrode pads excluding the source pad 21a are disposed in the main non-operating region 1b, on the front surface of the semiconductor substrate 10, separate from one another. The other electrode pads excluding the source pad 21a are a gate pad 21b of the main semiconductor device element 11, an electrode pad (OC pad) 22 of the current sensing portion 12, electrode pads (anode pad and cathode pad) 23a, 23b of the temperature sensing portion 13, an electrode pad (hereinafter, OV pad, not depicted) of the overcurrent protecting portion, an electrode pad (not depicted) of the arithmetic circuit portion, etc.

The other electrode pads excluding the source pad 21a, for example, have a substantially rectangular shape in a plan view thereof and have a surface area necessary for bonding later-described terminal pins 48b, 48c, and 48d, wires (not depicted), etc. FIG. 1 depicts an instance in which the other electrode pads excluding the source pad 21a are disposed in a single row along a border between the main non-operating region 1b and the intermediate region 3. Further, in FIG. 1, the source pad 21a, the gate pad 21b, the OC pad 22, the anode pad 23a, and the cathode pad 23b are depicted as rectangles indicated by "S", "G", "OC", "A", and "K", respectively (similarly in FIGS. 11 and 12).

The current sensing portion 12 is connected in parallel to the main semiconductor device element 11, operates under conditions similar to those of the main semiconductor device element 11, and has a function of detecting overcurrent (OC) flowing in the main semiconductor device element 11. The current sensing portion 12 is disposed separate from the main semiconductor device element 11. The current sensing portion 12 is a vertical MOSFET having unit cells each having a structure similar to that of the unit cells of the main semiconductor device element 11, the current sensing portion 12 having a fewer number of unit cells (for example, about 10) than the number of unit cells of the main semiconductor device element 11 (for example, at least about one thousand) and having a surface area smaller than that of the main semiconductor device element 11.

The unit cells of the current sensing portion 12 are disposed in a region (hereinafter, sensing effective region, hatched portion) 12a that is a portion of a region of the semiconductor substrate 10 covered by the OC pad 22. The unit cells of the current sensing portion 12 are disposed adjacent to one another in a direction parallel to the front surface of the semiconductor substrate 10. The direction along which the unit cells of the current sensing portion 12 are adjacent to one another, for example, is a same direction as that along which the unit cells of the main semiconductor device element 11 are adjacent to one another. The unit cells of the current sensing portion 12 are connected in parallel to one another by the OC pad 22.

Further, of the region of the semiconductor substrate 10 covered by the OC pad 22, a region thereof excluding the sensing effective region 12a is a sensing non-operating region 12b not functioning as the current sensing portion 12. The sensing non-operating region 12b is free of unit cells of the current sensing portion 12. In substantially an entire area of this region of the main non-operating region 1b excluding the sensing effective region 12a, a p-type base region 34b described hereinafter (refer to FIG. 2) extends in the semiconductor substrate 10, in a surface region thereof at the front surface thereof, the p-type base region 34b extending from the sensing effective region 12a.

The temperature sensing portion 13 has a function of detecting a temperature of the main semiconductor device element 11, using diode temperature characteristics. The temperature sensing portion 13 is disposed directly beneath the anode pad 23a and the cathode pad 23b. The temperature sensing portion 13, for example, may be a polysilicon diode configured by a polysilicon (poly-Si) layer provided on an interlayer insulating film 40 on the front surface of the semiconductor substrate 10, or may be a diffusion diode formed by pn junctions between p-type regions and n-type regions formed in the semiconductor substrate 10.

The overcurrent protecting portion (not depicted), for example, is a diode that protects the main semiconductor device element 11 from overvoltage (OV) such as surges. The current sensing portion 12, the temperature sensing portion 13, and the overcurrent protecting portion are controlled by the arithmetic circuit portion. The arithmetic circuit portion controls the main semiconductor device element 11 based on output signals from the current sensing portion 12, the temperature sensing portion 13, and the overcurrent protecting portion. The arithmetic circuit portion is configured by multiple semiconductor device elements such as CMOS circuits. An electrode pad is disposed for each semiconductor device element of the arithmetic circuit portion.

Figure 2:
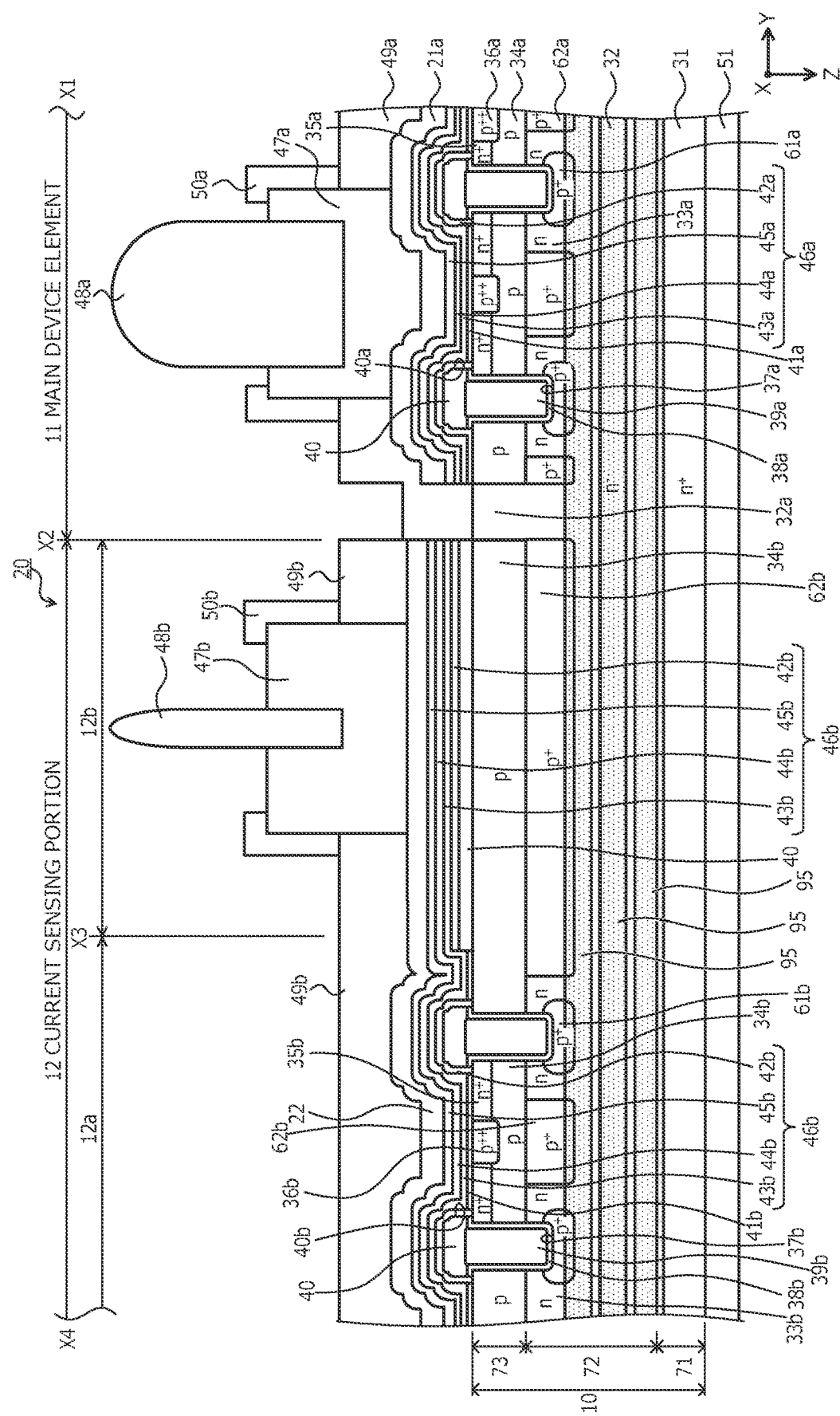
FIG. 2 is a cross-sectional view of a structure of an active region in FIG. 1.
Figure 3:
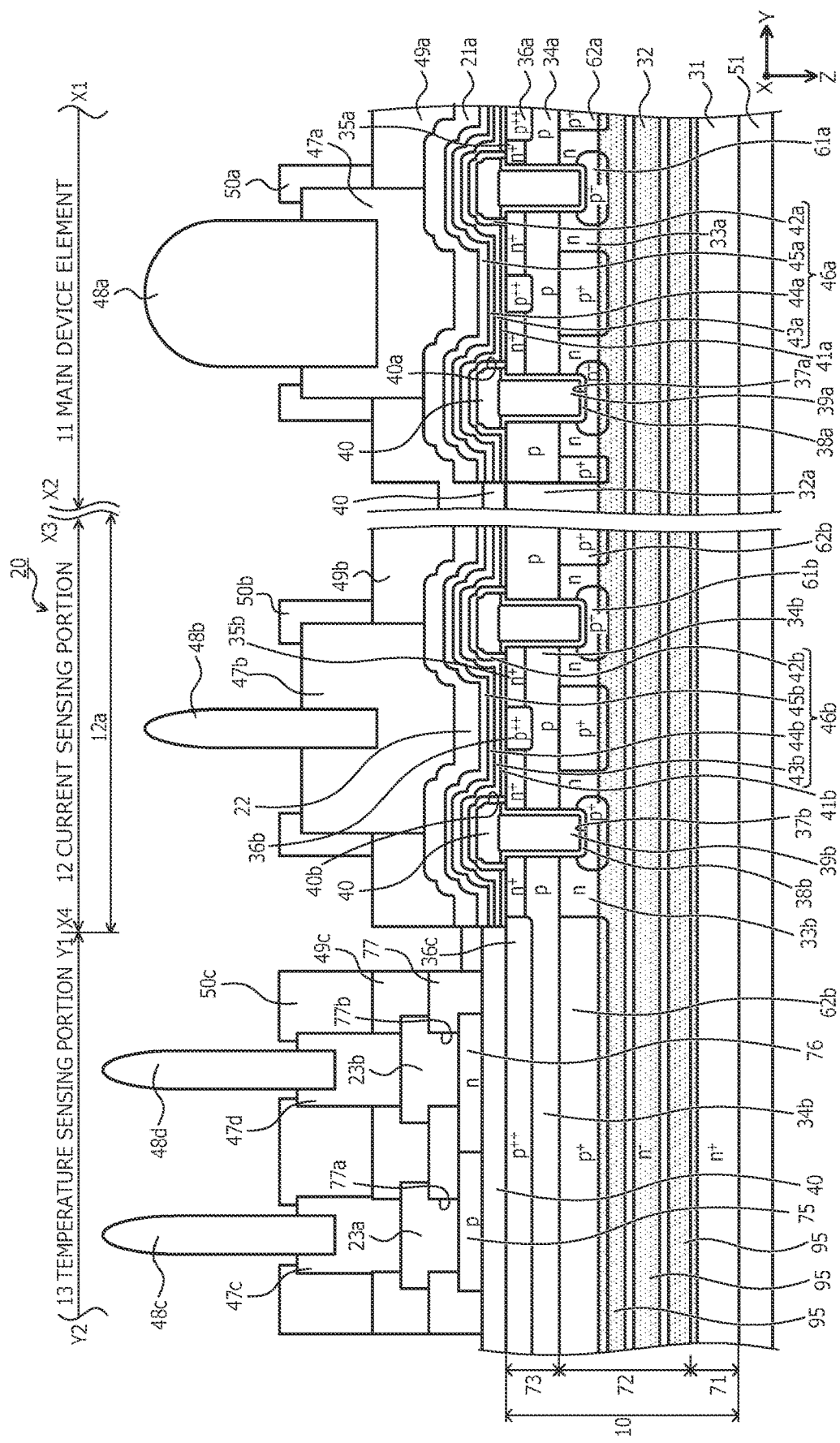
FIG. 3 is a cross-sectional view of the structure of an active region in FIG. 1.
Figure 4:
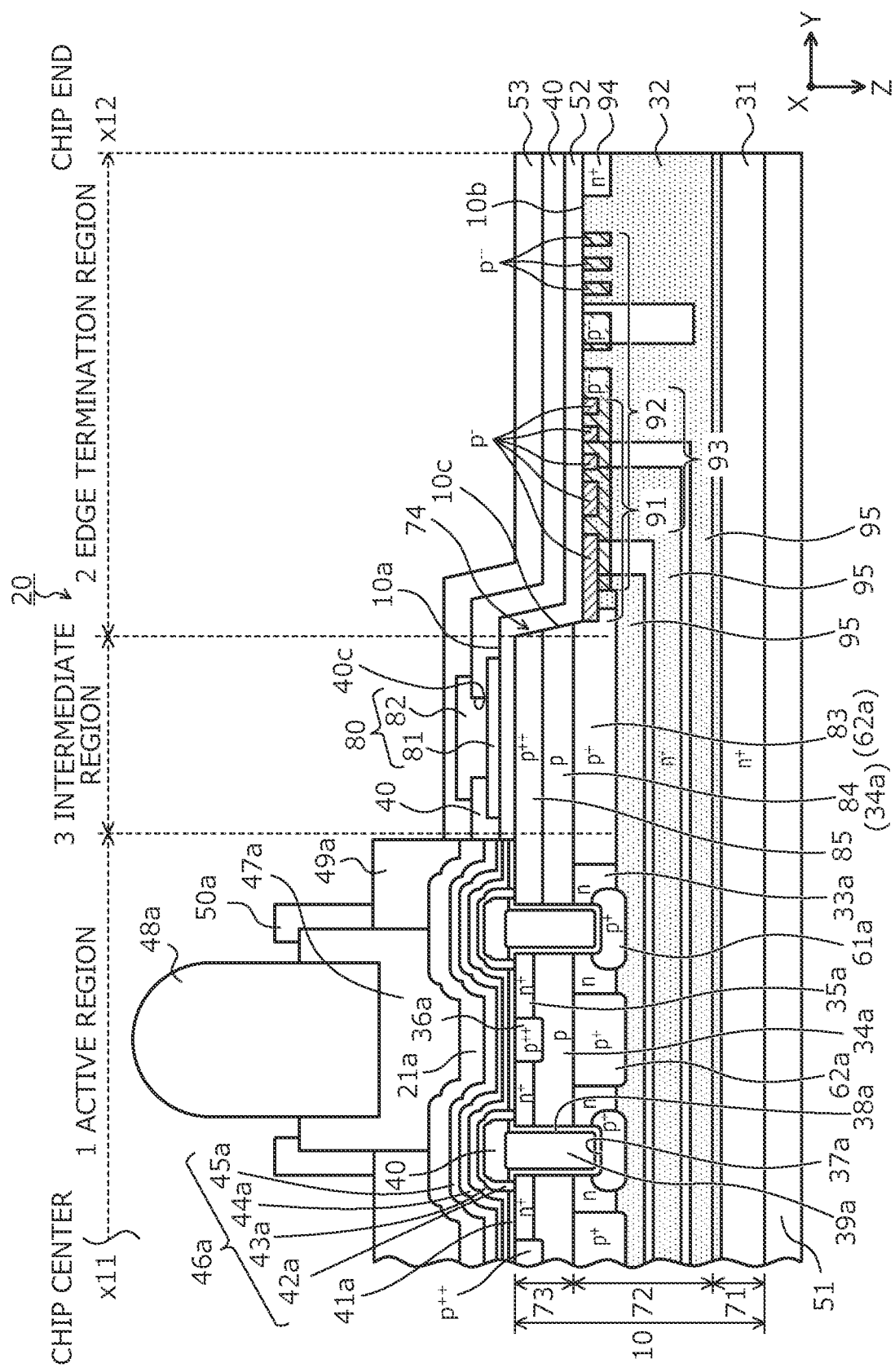
FIG. 4 is a cross-sectional view of an edge termination region in FIG. 1.

A cross-sectional view of the structure of the semiconductor device 20 according to the first embodiment is described. FIGS. 2 and 3 are cross-sectional views of the structure of the active region in FIG. 1. FIG. 4 is a cross-sectional view of the edge termination region in FIG. 1. FIG. 2 depicts a cross-section of the structure of the main effective region 1a and the current sensing portion 12 (along cutting line X1-X2-X3-X4 in FIG. 1). FIG. 2 depicts a cross-section of the structure of the main effective region 1a and the current sensing portion 12 (along cutting line X1-X2-X3-X4 in FIG. 1).

FIG. 4 depicts a cross-sectional view of the structure from near a border between the active region 1 and the intermediate region 3 to an end (chip end) of the semiconductor substrate 10 (along cutting line X11-X12 in FIG. 1). In FIG. 4, while a cross-sectional view of the structure of the intermediate region 3 and the edge termination region 2 near a border between the main effective region 1a and the intermediate region 3 is depicted, a cross-sectional view of the structure of the intermediate region 3 and the edge termination region 2 along an entire periphery of the active region 1 is similar to that depicted in FIG. 4. In FIGS. 2 to 4, only some of the respective unit cells of the main effective region 1a and of the sensing effective region 12a are depicted.

In the main effective region 1a, the main semiconductor device element 11 has general MOS gates (insulated gates having a three-layered structure including a metal, an oxide film, and a semiconductor) at the front side of the semiconductor substrate 10, configured by p-type base regions 34a, $n^+$-type source regions 35a, trenches 37a, gate insulating films 38a, and gate electrodes 39a. The semiconductor substrate 10 is formed by sequentially forming by epitaxial growth on a front surface of an $n^+$-type starting substrate 71 containing silicon carbide, silicon carbide layers 72, 73 that form an $n^-$-type drift region (first-conductivity-type region) 32 and the p-type base regions (second-conductivity-type regions) 34a.

The $n^+$-type starting substrate 71 forms an $n^+$-type drain region 31 of the main semiconductor device element 11 and of the current sensing portion 12. A first main surface of the semiconductor substrate 10 on a side thereof having the p-type silicon carbide layer 73 is a front surface and a second main surface of the semiconductor substrate 10 on a side thereof having the $n^+$-type starting substrate 71 (back surface of the $n^+$-type starting substrate 71) is a back surface. Here, while an instance in which the main semiconductor device element 11 and the circuit portion that protects and controls the main semiconductor device element 11 have wiring structures configured similarly to one another using pin-shaped wiring members (later-described terminal pins 48a to 48d), a wiring structure using wire instead of the pin-shaped wiring members may be adopted.

The trenches 37a penetrate the p-type silicon carbide layer 73 from the front surface of the semiconductor substrate 10 (surface of the p-type silicon carbide layer 73) in the depth direction Z and reach the $n^-$-type silicon carbide layer 72. The trenches 37a, for example, may be disposed in a striped pattern, extending in a direction parallel to the front surface of the semiconductor substrate 10 or may be disposed in a matrix-like shape, when viewed from the front side of the semiconductor substrate 10. FIGS. 2 to 4, for example, depict the trenches 37a extending in a striped pattern in a first direction X along which the electrode pads 21b, 23a, 23b, and 22 are arranged (refer to FIG. 1).

In the trenches 37a, the gate electrodes 39a are provided via the gate insulating films 38a, respectively. Between adjacent trenches 37a of the trenches 37a, the p-type base regions 34a, the $n^+$-type source regions 35a, and $p^{++}$-type contact regions 36a are selectively provided in surface regions of the semiconductor substrate 10 at the front surface thereof. The p-type base regions 34a, the $n^+$-type source regions 35a, and the $p^{++}$-type contact regions 36a extend linearly along the first direction X similarly to the trenches 37a, when viewed from the front side of the semiconductor substrate 10.

The $n^+$-type source regions 35a and the $p^{++}$-type contact regions 36a are selectively provided between the front surface of the semiconductor substrate 10 and the p-type base regions 34a to be in contact with the p-type base regions 34a. The $n^+$-type source regions 35a and the $p^{++}$-type contact regions 36a are exposed at the front surface of the semiconductor substrate 10. In the main effective region 1a, exposure at the front surface of the semiconductor substrate 10 means being in contact with later-described NiSi films 41a in later-described first contact holes 40a of the interlayer insulating film 40.

The $n^+$-type source regions 35a are in contact with the gate insulating films 38a at sidewalls of the trenches 37a. The $n^+$-type source regions 35a are not provided beyond an outermost trench 37a (closest to a chip end) of the trenches 37a, in a second direction Y. The $p^{++}$-type contact regions 36a are provided further from the trenches 37a than are the $n^+$-type source regions 35a. The $p^{++}$-type contact regions 36a may be omitted. In this instance, the p-type base regions 34a reach the front surface of the semiconductor substrate 10 instead of the $p^{++}$-type contact regions 36a.

In the semiconductor substrate 10, the $n^-$-type drift region 32 is provided between the p-type base regions 34a and the $n^+$-type drain region 31 (the $n^+$-type starting substrate 71), in contact with the p-type base regions 34a and the $n^+$-type drain region 31. In the $n^-$-type drift region 32, lifetime killer regions 95 (hatched portions in FIGS. 2 to 4) are provided in which recombination centers that capture (trap) positive holes (holes) are introduced thereby reducing the lifetime of minority carriers (holes) therein. The lifetime killer regions 95 are described hereinafter.

Between the p-type base regions 34a and the $n^-$-type drift region 32, n-type current spreading regions 33a may be provided in contact with these regions. The n-type current spreading regions 33a are a so-called current spreading layer (CSL) that reduces carrier spreading resistance. The n-type current spreading regions 33a are each provided between a first $p^+$-type region 61a and a second $p^+$-type region 62a that are adjacent to one another and described hereinafter; the n-type current spreading regions 33a extend from the p-type base regions 34a and reach positions closer to a drain electrode (second electrode) 51 than are bottoms of the trenches 37a.

Further, in the semiconductor substrate 10, the first and the second $p^+$-type regions 61a, 62a that mitigate electric field applied to the bottoms of the trenches 37a may be provided at positions closer to the $n^+$-type drain region 31 than are the p-type base regions 34a. The first $p^+$-type regions 61a are provided separate from the p-type base regions 34a and face the bottoms of the trenches 37a in the depth direction Z, respectively. Each of the second $p^+$-type regions 62a is provided between a pair of adjacent trenches 37a of the trenches 37a to be separate from the first $p^+$-type regions 61a and the trenches 37a and in contact with the p-type base regions 34a.

The interlayer insulating film 40 is provided in an entire area of the front surface of the semiconductor substrate 10 and covers the gate electrodes 39a. In a portion not depicted, all of the gate electrodes 39a of the main semiconductor device element 11 are electrically connected to the gate pad 21b (refer to FIG. 1) via a gate runner 80 of the intermediate region 3 (refer to FIG. 4). In the first contact holes 40a that penetrate through the interlayer insulating film 40 in the depth direction Z and reach the semiconductor substrate 10, the $n^+$-type source regions 35a and the $p^{++}$-type contact regions 36a of the main semiconductor device element 11 are exposed.

In the first contact holes 40a, the nickel silicide (hereinafter, NiSi, $Ni_2Si$, or thermally stable $NiSi_2$, collectively "NiSi") films 41a are in ohmic contact with the semiconductor substrate 10 and electrically connected to the $n^+$-type source regions 35a and the $p^{++}$-type contact regions 36a. In an instance in which the $p^{++}$-type contact regions 36a are omitted, instead of the $p^{++}$-type contact regions 36a, the p-type base regions 34a are exposed in the first contact holes 40a and electrically connected to the NiSi films 41a.

In an entire area of the surface of the interlayer insulating film 40 and entire areas of the surfaces of the NiSi films 41a in the main effective region 1a, a barrier metal 46a is provided along the surfaces of the interlayer insulating film 40 and the NiSi films 41a. The barrier metal 46a has a function of preventing interaction between metal films of the barrier metal 46a or between regions facing each other across the barrier metal 46a. The barrier metal 46a, for example, may have a layered structure in which a first titanium nitride (TiN) film 42a, a first titanium (Ti) film 43a, a second TiN film 44a, and a second Ti film 45a are sequentially stacked.

The first TiN film 42a covers an entire area of the surface of the interlayer insulating film 40. The first TiN film 42a is not provided on the front surface of the semiconductor substrate 10 in portions thereof where the NiSi films 41a is formed. The first Ti film 43a is provided on the surface of the first TiN film 42a and on the surfaces of the NiSi films 41a. The second TiN film 44a is provided on the surface of the first Ti film 43a. The second Ti film 45a is provided on the surface of the second TiN film 44a. The barrier metal 46a, for example, is not provided in the temperature sensing portion 13.

The source pad 21a is provided in an entire area of the second Ti film 45a and is electrically connected to the $n^+$-type source regions 35a and the p-type base regions 34a via the barrier metal 46a and the NiSi films 41a. The source pad 21a, for example, may be an aluminum (Al) film, an aluminum-silicon (Al—Si) film, or an aluminum-silicon-copper (Al—Si—Cu) film having a thickness of about 5 μm. The source pad 21a, the barrier metal 46a, and the NiSi films 41a function as a source electrode of the main semiconductor device element 11.

A first end of each of the terminal pins 48a is bonded on the source pad 21a, via a plating film 47a and a solder layer (not depicted). A second end of each of the terminal pins 48a is bonded to a metal bar (not depicted) disposed so as to face the front surface of the semiconductor substrate 10. Further, the second end of each of the terminal pins 48a is exposed outside a case (not depicted) in which the semiconductor substrate 10 is mounted, the second ends being electrically connected to an external device (not depicted). The terminal pins 48a are wiring members having a round, rod-like shape (cylinder shape) having a predetermined diameter.

The terminal pins 48a are soldered to the plating films 47a in a substantially upright state with respect to the front surface of the semiconductor substrate 10. The terminal pins 48a are external connection terminals that lead out electric potential of the source pad 21a and are connected to an external ground potential (minimum electric potential). Portions of the surface of the source pad 21a other than portions having the plating films 47a are covered by first protective films 49a, and borders between the plating films 47a and the first protective films 49a are covered by second protective films 50a. The first and the second protective films 49a, 50a, for example, are polyimide films.

The drain electrode 51 is in ohmic contact with an entire area of the back surface of the semiconductor substrate 10 (back surface of the $n^+$-type starting substrate 71). On the drain electrode 51, a drain pad (electrode pad, not depicted) having a stacked structure in which, for example, a Ti film, a nickel (Ni) film, and a gold (Au) film are sequentially stacked is provided. The drain pad is soldered to a metal base plate (not depicted) of an insulated substrate, the metal plate being formed by, for example, a copper foil, and at least a portion of the drain pad is in contact with a base portion of a cooling fin (not depicted) via the metal base plate.

In this manner, the terminal pins 48a are bonded to the source pad 21a on the front surface of the semiconductor substrate 10 and the drain pad of the back surface is bonded to the metal base plate of the insulated substrate, whereby a double-sided cooling structure in which a cooling structure is provided on both sides of the semiconductor substrate 10 is formed. Heat generated by the semiconductor substrate 10 is radiated from a fin portion of the cooling fin via the metal base plate bonded to the drain pad at the back surface of the semiconductor substrate 10 and is radiated from the metal bar to which the terminal pins 48a of the front surface of the semiconductor substrate 10 are bonded.

The current sensing portion 12 includes the p-type base region 34b, $n^+$-type source regions 35b, $p^{++}$-type contact regions 36b, trenches 37b, gate insulating films 38b, gate electrodes 39b, and the interlayer insulating film 40 respectively having configurations similar to configurations of corresponding parts of the main semiconductor element 11. Parts of the MOS gates of the current sensing portion 12 are provided in the sensing effective region 12a of the main non-operating region 1b. The p-type base region 34b is apart from the p-type base regions 34a of the main semiconductor device element 11 with an $n^-$-type region 32a of the semiconductor substrate 10 at the front surface thereof intervening therebetween.

The p-type base region 34b, for example, extends across substantially an entire area of the main non-operating region 1b, from the sensing effective region 12a. The current sensing portion 12, similarly to the main semiconductor device element 11, may have n-type current spreading regions 33b, first $p^+$-type regions 61b, and second $p^+$-type regions 62b. The $p^{++}$-type contact regions 36b may be omitted. The gate electrodes 39b are electrically connected to the gate pad 21b (refer to FIG. 1) via the gate runner 80 of the intermediate region 3. The gate electrodes 39b are covered by the interlayer insulating film 40.

In the sensing effective region 12a, second contact holes 40b that penetrate the interlayer insulating film 40 in the depth direction Z and reach the semiconductor substrate 10 are provided, exposing the $n^+$-type source regions 35b and the $p^{++}$-type contact regions 36b. In the sensing effective region 12a, similarly to the main semiconductor device element 11, NiSi films 41b and a barrier metal 46b are provided at the front surface of the semiconductor substrate 10. Reference characters 42b, 43b, 44b, and 45b are respectively a first TiN film, a first Ti film, a second TiN film, and a second Ti film that configure the barrier metal 46b.

In the second contact holes 40b, the NiSi films 41b are in ohmic contact with the semiconductor substrate 10 and are electrically connected to the $n^+$-type source regions 35b and the $p^{++}$-type contact regions 36b. In an instance in which the $p^{++}$-type contact regions 36b are omitted, instead of the $p^{++}$-type contact regions 36b, the p-type base region 34b is exposed in the second contact holes 40b and electrically connected to the NiSi films 41b. The barrier metal 46b extends on the interlayer insulating film 40 in the sensing non-operating region 12b.

In an entire area of the surface of the barrier metal 46b, the OC pad 22 is provided separate from the source pad 21a. The OC pad 22 is electrically connected to the $n^+$-type source regions 35b and the p-type base region 34b via the barrier metal 46b and the NiSi films 41b. The OC pad 22, for example, is formed concurrently with the source pad 21a, using a same material as that of the source pad 21a. The OC pad 22, the barrier metal 46b, and the NiSi films 41b function as a source electrode of the current sensing portion 12.

On the OC pad 22, the terminal pins 48b are bonded by a wiring structure similar to the wiring structure on the source pad 21a. The terminal pins 48b are wiring members having a round, rod-like shape (cylinder shape) having a diameter smaller than the diameter of the terminal pins 48a. The terminal pins 48b, for example, are external connection terminals that lead electric potential of the OC pad 22 out of the device and connect the OC pad 22 to a ground potential via an external resistor (not depicted). Reference characters 47b, 49b, and 50b are respectively plating films, first protective films, and second protective films configuring the wiring structure on the OC pad 22.

The p-type base regions 34a of the main effective region 1a and the p-type base region 34b of the sensing effective region 12a are separated from a p-type region (not depicted) for device element isolation, by a non-depicted $n^-$-type region in a surface region of the semiconductor substrate 10. The p-type region for device isolation is provided in the edge termination region 2, in a substantially rectangular shape surrounding a periphery of the active region and is a floating p-type region that forms a pn junction with the $n^-$-type drift region 32 and thereby, forms parasitic diode electrically isolating the active region 1 and the edge termination region 2.

The temperature sensing portion 13, for example, is a polysilicon diode formed by a pn junction between a p-type polysilicon layer 75 that is a p-type anode region and an n-type polysilicon layer 76 that is an n-type cathode region (FIG. 3). The p-type polysilicon layer 75 and the n-type polysilicon layer 76 are provided on the interlayer insulating film 40 in the main non-operating region 1b. The temperature sensing portion 13 is electrically insulated from the semiconductor substrate 10, the main semiconductor device element 11, and the current sensing portion 12 by the interlayer insulating film 40.

The anode pad 23a and the cathode pad 23b are in contact with the p-type polysilicon layer 75 and the n-type polysilicon layer 76 via third and fourth contact holes 77a, 77b of an interlayer insulating film 77 that covers the anode pad 23a and the cathode pad 23b. The anode pad 23a and the cathode pad 23b, for example, are formed concurrently with the source pad 21a, using a same material as that of the source pad 21a. On the anode pad 23a and on the cathode pad 23b, the terminal pins 48c, 48d are respectively bonded by a wiring structure similar to the wiring structure on the source pad 21a.

The terminal pins 48c, 48d are external connection terminals that lead out electric potential of the anode pad 23a and the cathode pad 23b, respectively. The terminal pins 48c, 48d are wiring members having a round, rod-like shape (cylinder shape) having a predetermined diameter corresponding to the current capability of the temperature sensing portion 13. Reference characters 47c and 47d are plating films forming the wiring structure on the anode pad 23a and the wiring structure on the cathode pad 23b, respectively. Reference characters 49c and 50c are respectively first and second protective films configuring the wiring structure on the temperature sensing portion 13.

While not depicted in FIGS. 2 to 4, in the main non-operating region 1b, other than the current sensing portion 12 and the temperature sensing portion 13, a gate pad portion 14 is provided (refer to FIG. 1). The gate pad portion 14 is a region in which the gate pad 21b of the main semiconductor device element 11 is provided (refer to FIG.

1). In the gate pad portion 14, MOS gates of the main semiconductor device element 11 may extend from the main effective region 1a. MOS gates formed in the gate pad portion 14 are covered by the interlayer insulating film 40.

The gate pad 21b is provided on the interlayer insulating film 40 in the main non-operating region 1b, separate from the other electrode pads. The gate pad 21b, for example, is formed concurrently with the source pad 21a using a same material as that of the source pad 21a and is configured by a non-depicted NiSi film and barrier metal. On the gate pad 21b as well, for example, terminal pins (not depicted) that lead out electric potential of the gate pad 21b are bonded by a wiring structure similar to the wiring structure on the source pad 21a.

At the front surface of the semiconductor substrate 10, for example, the p-type silicon carbide layer 73 is removed from an entire area of the edge termination region 2, whereby a drop 74 is formed, whereby an outer portion (second face) 10b of the front surface closer to the chip ends than is a center (chip center) portion (first face) 10a of the front surface is lower (recessed) to be closer to the drain electrode 51 than is the first face 10a. The p-type silicon carbide layer 73 closer to the chip center than is the drop 74 is left having a mesa-like shape (trapezoid) in a cross-sectional view thereof and a surface (exposed surface) of the n$^-$-type silicon carbide layer 72 closer to the chip ends than is the drop 74 becomes the second face 10b of the front surface of the semiconductor substrate 10.

The active region 1 and the intermediate region 3 are device-element-isolated from the edge termination region 2 by a portion (mesa edge of the drop 74, hereinafter, third face) 10c of the front surface of the semiconductor substrate 10, connecting the first face 10a and the second face 10b. The drop 74 of the front surface of the semiconductor substrate 10 may be a single step or may include multiple steps (in FIG. 4, a single step). In the intermediate region 3, a p$^+$-type region (hereinafter, outermost p$^+$-type region) 83, a p-type base region 84, and a p$^{++}$-type contact region 85 are provided in surface regions of the semiconductor substrate 10, at the first face 10a of the front surface thereof.

The outermost p$^+$-type region 83, the p-type base region 84, and the p$^{++}$-type contact region 85 are fixed at the electric potential of the source pad 21a and in the intermediate region 3, have a function of making electric field at the first face 10a of the front surface of the semiconductor substrate 10 uniform and a function of enhancing the breakdown voltage. The outermost p$^+$-type region 83, the p-type base region 84, and the p$^{++}$-type contact region 85 surround a periphery of the active region 1 in a ring-shape in a plan view thereof. Of the second p$^+$-type regions 62a of the main semiconductor device element 11, a second p$^+$-type region 62a adjacent to the intermediate region 3 in the second direction Y and the outermost p$^+$-type region 83 are connected to each other.

Further, as described above, the outermost p$^+$-type region 83 is disposed in a ring-shape surrounding a periphery of the active region 1 and is connected to ends (longitudinal ends in the first direction X) of all of the first and the second p$^+$-type regions 61a, 62a of the main semiconductor device element 11. Further, the outermost p$^+$-type region 83 extends from the intermediate region 3 and extends closer to the chip ends than is the drop 74; the outermost p$^+$-type region 83 surrounds an entire border between the second face 10b and the third face 10c of the front surface of the semiconductor substrate 10, the border having a substantially rectangular shape in a plane view thereof. The outermost p$^+$-type region 83 may be connected to the first and the second p$^+$-type regions 61b, 62b of the current sensing portion 12.

The p-type base region 84 is connected to the p-type base regions 34a of the main semiconductor device element 11 at a portion not depicted. The p-type base region 84 is provided between the outermost p$^+$-type region 83 and the p$^{++}$-type contact region 85, and is exposed at the third face 10c of the front surface of the semiconductor substrate 10. Exposure at the first to the third faces 10a to 10c of the front surface of the semiconductor substrate 10 means being in contact with a field oxide film 52 on the first to the third faces 10a to 10c. The p-type base region 84 may be connected to the p-type base region 34b of the current sensing portion 12.

The p$^{++}$-type contact region 85 is provided between the first face 10a of the front surface of the semiconductor substrate 10 and the p-type base region 84, in contact with the p-type base region 84. The p$^{++}$-type contact region 85 is exposed at the first face 10a and the third face 10c of the front surface of the semiconductor substrate 10. The p$^{++}$-type contact region 85 is an extraction region for pulling out holes (positive holes) from the n$^-$-type drift region 32 to the source pad 21a when the MOSFET is OFF and in the active region 1, is in contact with the NiSi films 41a of the main semiconductor device element 11.

The field oxide film 52 and the interlayer insulating film 40 are sequentially stacked so as to cover the first face 10a of the front surface of the semiconductor substrate 10 in the intermediate region 3 and the second and the third faces 10b, 10c of the front surface of the semiconductor substrate 10. In the intermediate region 3, a gate polysilicon wiring layer 81 facing the p$^{++}$-type contact region 85 in the depth direction Z is provided between the field oxide film 52 and the interlayer insulating film 40. A gate metal wiring layer 82 is in contact with a gate polysilicon wiring layer 81 in the fifth contact hole 40c formed in the interlayer insulating film 40.

The gate metal wiring layer 82, for example, is formed concurrently with the source pad 21a, using a same material as that for the source pad 21a. The gate polysilicon wiring layer 81 and the gate metal wiring layer 82 are provided in a ring-like shape surrounding a periphery of the active region 1 when viewed from the front side of the semiconductor substrate 10 and configure the gate runner 80. All of the gate electrodes 39a of the main semiconductor device element 11, all of the gate electrodes 39b of the current sensing portion 12, and the gate pad 21b (refer to FIG. 1) are electrically connected to the gate runner 80.

The gate runner 80 electrically connects all of the gate electrodes 39a of the main semiconductor device element 11 and all of the gate electrodes 39b of the current sensing portion 12 to the gate pad 21b. A passivation film 53 covers the interlayer insulating film 40 in the edge termination region 2 and the intermediate region 3 and covers the gate metal wiring layer 82. The passivation film 53, for example, is a silicon nitride (SiN) film. In multiple openings in the passivation film 53, different electrode pads (the source pad 21a, the gate pad 21b, the OC pad 22, the anode pad 23a, and the cathode pad 23b) are respectively exposed.

In the edge termination region 2, a JTE structure 93 is provided as a voltage withstanding structure. The JTE structure 93 is a voltage withstanding structure in which multiple p-type regions (herein, multiple p$^-$-type regions 91 and multiple p$^{--}$-type regions 92 indicated by mutually different diagonal-lined hatching in FIG. 4), each having an impurity concentration lower than an impurity concentration of the outermost p$^+$-type region 83, are selectively disposed in descending order of impurity concentrations thereof with increasing proximity to the chip ends. In surface regions of the semiconductor substrate 10, at the second face 10b of the front surface thereof, the p$^-$-type regions 91 and the p$^{---}$-type regions 92 are selectively provided in the n$^-$-type silicon carbide layer 72 and are exposed at the second face 10b.

The p$^-$-type regions 91 and the p$^{---}$-type regions 92 surround a periphery of the active region 1 in a ring-like shape as viewed from the front side of the semiconductor substrate 10. The p$^-$-type regions 91 are disposed separate from one another, in descending order of widths thereof with increasing proximity to the chip ends. An innermost (closest to the chip center) p$^-$-type region 91 of the p$^-$-type regions 91 is positioned at a border between the second and the third faces 10b, 10c of the front surface of the semiconductor substrate 10, and is exposed at the second face 10b. The innermost p$^-$-type region 91 is adjacent to the outermost p$^+$-type region 83 and closer to the chip ends than is the outermost p$^+$-type region 83. An end of the innermost p$^-$-type region 91, the end thereof closest to the active region 1, is surrounded by the outermost p$^+$-type region 83.

The p$^{---}$-type regions 92 are disposed separate from one another, in descending order of widths thereof with increasing proximity to the chip ends. An innermost (closest to the chip center) p$^{---}$-type region 92 of the p$^{---}$-type regions 92 is adjacent to an end of the outermost p$^+$-type region 83, the end thereof closest to the chip ends. The innermost p$^{---}$-type region 92 surrounds a portion of the innermost p$^-$-type region 91, the portion thereof closer to the chip ends than is the outermost p$^+$-type region 83 and extends toward the chip ends to surround all of the p$^-$-type regions 91 positioned closer to the chip ends than is the outermost p$^+$-type region 83. The innermost p$^{---}$-type region 92 is exposed at the second face 10b of the front surface of the semiconductor substrate 10, in between adjacent p$^-$-type regions 91 of the p$^-$-type regions 91.

Between adjacent p$^{---}$-type regions 92 of the p$^{---}$-type regions 92, the n$^-$-type drift region 32 extends from a drain side and reaches the second face 10b of the front surface of the semiconductor substrate 10. Therefore, the JTE structure 93 has a structure in which, between each pair of adjacent p$^-$-type regions 91 of the p$^-$-type regions 91, the p$^-$-type regions 92 having a p-type impurity concentration lower than that of the p$^-$-type regions 91 are respectively disposed and between each pair of adjacent p$^{---}$-type regions 92 of the p$^{---}$-type regions 92, portions of the n$^-$-type drift region 32 having a p-type impurity concentration lower than that of the p$^{---}$-type regions 92 are respectively disposed.

In this manner, due to the structure in which the p$^{---}$-type regions 92 are provided between adjacent p$^-$-type regions 91 of the p$^-$-type regions 91, as compared to an instance of a structure other than said structure, the p-type impurity concentration gradient between the adjacent p$^-$-type regions 91 is smaller and electric field applied between the adjacent p$^-$-type regions 91 is mitigated. Due to the structure in which portions of the n$^-$-type drift region 32 are provided between adjacent p$^{---}$-type regions 92, as compared to an instance of a structure other than said structure, the p-type impurity concentration gradient between the adjacent p$^{---}$-type regions 92 is smaller and electric field applied between the adjacent p$^-$-type regions 91 is mitigated.

The p$^-$-type regions 91 and the p$^{---}$-type regions 92 are electrically connected to the p-type base regions 34a, 34b by the outermost p$^+$-type region 83. A predetermined breakdown voltage at the edge termination region 2 is secured by a pn junction between the p$^-$-type regions 91, the p$^{---}$-type regions 92, and the n$^-$-type drift region 32. In surface regions of the semiconductor substrate 10, at the second face 10b of the front surface thereof, an n$^+$-type channel stopper region 94 is selectively provided in the n$^-$-type silicon carbide layer 72. The n$^+$-type channel stopper region 94 is provided closer to the chip ends than is the JTE structure 93, the n$^+$-type channel stopper region 94 is provided separate from the JTE structure 93 and is exposed at the chip ends.

Next, the lifetime killer regions 95 are described in detail. The lifetime killer regions 95 are regions in which recombination centers that trap positive holes in the n$^-$-type silicon carbide layer 72 are introduced. In portions where the lifetime killer regions 95 are provided, the lifetime of the minority carriers (holes) of the n$^-$-type drift region 32 is reduced. The lifetime killer regions 95 are regions in which recombination centers are introduced into the n$^-$-type silicon carbide layer 72 by helium (He) irradiation or proton (W) irradiation which may form an impurity state in substantially a center (deep energy levels away from conductive and valance bands) of the bandgap of silicon carbide.

While formation of an impurity state substantially in the center of the bandgap increases leak current that occurs during recombination with the impurity state, a magnitude of the leak current is determined by a width of the bandgap and the wider is the bandgap, the greater the leak current may be reduced. As described above, the bandgap of silicon carbide is wide compared to that of silicon and therefore, even when the impurity state is formed in substantially the center of the bandgap of silicon carbide, the leak current that occurs during recombination at the impurity state is extremely small to an extent that no problems occur with electrical characteristics of the semiconductor device 20.

The impurity state formed substantially in the center of the bandgap of silicon carbide become recombination centers that trap charge (hole-electron pairs (e$^+$e$^-$)) generated at locations where a rays enter, the a rays being generated by nuclear reactions of secondary cosmic ray neutrons that have high energy and enter the semiconductor substrate 10. For example, when the impurity state is formed at a shallow energy level near the valance band of the bandgap of silicon carbide, the charge trapped by the impurity state transitions from near the valance band to the conduction band and therefore, energy substantially equal to that of the bandgap is necessary.

On the other hand, by the formation of the impurity state in the center of the bandgap of silicon carbide, the energy for transitioning the charge trapped by the impurity state to the conduction band is half of that of the bandgap. In addition, the energy released when electrons (electrons (e$^-$)) of the charge (hole-electron pairs) trapped by the impurity state transition from the impurity state to the valance band may be used as energy for transitioning positive holes (holes (e$^+$)) of the hole-charge from the impurity state to the conduction band.

Further, the lifetime killer regions 95 are disposed in regions through which a depletion layer spreads from pn junctions between the first and the second p$^+$-type regions 61a, 62a, the n-type current spreading regions 33a, and the n$^-$-type drift region 32, when the main semiconductor device element 11 is OFF. As a result, when the main semiconductor device element 11 is OFF, charge generated by a rays generated due to secondary cosmic ray neutrons that enter the semiconductor substrate 10 may be recombined by the impurity state and reduced, thereby enabling suppression of avalanche breakdown caused by the charge.

For example, the lifetime killer regions 95 include pn junctions between the first and the second p$^+$-type regions 61a, 62a, the n-type current spreading regions 33a, and the n$^-$-type drift region 32 and are provided closer to the drain electrode 51 than are the pn junctions. In addition, the lifetime killer regions 95 are disposed at positions closer to the n⁺-type drain region 31 than are the bottoms of the trenches 37a so as not be formed in the gate electrodes 39a. When the lifetime killer regions 95 are formed in the gate electrodes 39a, gate characteristics of the main semiconductor device element 11 degrade.

For example, the lifetime killer regions 95 are provided at different positions in the n⁻-type drift region 32 of the main effective region 1a, separate from one another and extending in a linear shape along a direction parallel to the front surface of the semiconductor substrate 10. The lifetime killer regions 95 suffice to be positioned closer to the drain electrode 51 than are the bottoms of the trenches 37a of the main semiconductor device element 11 and may extend closer to a source side (the n⁺-type source regions 35a) than are the pn junctions between the first and the second p⁺-type regions 61a, 62a of the main effective region 1a, the n-type current spreading regions 33a, and the n⁻-type drift region 32.

Similarly to the main effective region 1a, in the current sensing portion 12, closer to the drain electrode 51 than are the bottoms of the trenches 37b, the lifetime killer regions 95 extend in the n⁻-type drift region 32 in the main non-operating region 1b. Further, the lifetime killer regions 95 extend from the active region 1 to the edge termination region 2 in a direction parallel to the front surface of the semiconductor substrate 10 and in the edge termination region 2, the lifetime killer regions 95 extend toward the second face 10b of the front surface of the semiconductor substrate 10, for example, in an L-shape so as to surround a periphery of the active region 1 and reach the second face 10b, in a cross-sectional view thereof (FIG. 4).

Widths of portions of the lifetime killer regions 95 extending in a linear shape along the depth direction Z may be variously changed and, for example, the closer a portion is to the chip ends, the wider the width thereof may be. The lifetime killer regions 95 may extend from the active region 1 to the chip ends in a direction parallel to the front surface of the semiconductor substrate 10 (not depicted). In this instance, in the edge termination region 2, multiple lifetime killer regions that extend in a linear shape from the second face 10b of the front surface of the semiconductor substrate 10 in the depth direction Z may be provided in the n⁻-type drift region 32.

In other words, in the edge termination region 2, the lifetime killer regions may be provided in the n⁻-type drift region 32 so as to have a lattice-like shape in a cross-sectional view thereof. When the lifetime killer regions that extend in a linear shape from the second face 10b of the front surface of the semiconductor substrate 10 in the depth direction Z are provided, the lifetime killer regions that extend in a linear shape in the depth direction Z may be disposed in a striped pattern extending in a direction parallel to the front side of the semiconductor substrate 10 or may be disposed in a ring-like shape surrounding a periphery of the active region, when viewed from the front surface of the semiconductor substrate 10.

Recombination centers are capable of extinguishing the charge generated due to the incidence of secondary cosmic ray neutrons and as many recombination centers as possible may be introduced in the n⁻-type drift region 32 in which a depletion layer spreads when the main semiconductor device element 11 is OFF. Therefore, the lifetime killer regions 95 may be disposed over a wide range in the n⁻-type drift region 32, from the active region 1 to the edge termination region 2. The lifetime killer regions 95 may be provided in an entire area of the n⁻-type drift region 32, spanning the active region 1 to the chip ends.

Operation of the semiconductor device 20 according to the first embodiment is described. In a state in which voltage that is positive with respect to the source electrode (the source pad 21a) of the main semiconductor device element 11 is applied to the drain electrode 51 and voltage that is at least equal to a threshold voltage is applied the gate electrodes 39a of the main semiconductor device element 11, an n-type inversion layer (channel) is formed in portions of the p-type base regions 34a along the trenches 37a of the main semiconductor device element 11. As a result, current (hereinafter, main current) flows from the n⁺-type drain region 31 toward the n⁺-type source regions 35a of the main semiconductor device element 11 and the main semiconductor device element 11 turns ON.

At this time, under conditions similar to those of the main semiconductor device element 11, in state in which current that is positive with respect to the source electrode (the OC pad 22) of the current sensing portion 12 is applied to the drain electrode 51 and voltage at least equal to a threshold voltage is applied to the gate electrodes 39b of the current sensing portion 12, an n-type inversion layer is formed in portions of the p-type base region 34b along the trenches 37b in the current sensing portion 12. As a result, current (hereinafter, sensing current) flows from the n⁺-type drain region 31 toward the n⁺-type source regions 35b of the current sensing portion 12 and the current sensing portion 12 turns ON.

The sensing current flows to a ground point, through a resistor that is an external component connected between the n⁺-type source regions 35b of the current sensing portion 12 and the ground point. As a result, voltage drop occurs in the resistor. When overcurrent is applied to the main semiconductor device element 11, the sensing current of the current sensing portion 12 increases according to the magnitude of the overcurrent in the main semiconductor device element 11 and the voltage drop at the resistor between the n⁺-type source regions 35b of the current sensing portion 12 and the ground point increases. The magnitude of this voltage drop at this resistor is monitored, thereby enabling detection of overcurrent in the main semiconductor device element 11.

On the other hand, when voltage lower than the threshold voltage is applied to the gate electrodes 39a, the pn junctions between the first and the second p⁺-type regions 61a, 62a, the n-type current spreading regions 33a, and the n⁻-type drift region 32 are reverse biased, whereby the main semiconductor device element 11 maintains the OFF state. When voltage lower than the threshold voltage is also applied to the gate electrodes 39b of the current sensing portion 12, the pn junctions between the first and the second p⁺-type regions 61b, 62b, the n-type current spreading regions 33b, and the n⁻-type drift region 32 are reverse biased, whereby the current sensing portion 12 maintains the OFF state.

When the main semiconductor device element 11 and the current sensing portion 12 maintain the OFF state, in the n⁻-type drift region 32 in the main semiconductor device element 11 and in the current sensing portion 12, a depletion layer spreads from the active region 1 to the edge termination region 2. At this time, when secondary cosmic ray neutrons having high energy enter the semiconductor substrate 10 and nuclear reactions between the secondary cosmic ray neutrons and elements in the semiconductor occur, α rays are generated, the α rays enter near the locations where the secondary cosmic ray neutrons entered, and charge (hole-electron pairs (e⁺e⁻)) is generated.

In this manner, even when a rays enter the semiconductor substrate 10, before charge is generated over a wide range of the n⁻-type drift region 32 from the locations where the a rays entered, the charge is trapped by the recombination centers introduced in the lifetime killer regions 95 and the trapped charge recombines and is extinguished. Therefore, when the semiconductor device 20 according to the first embodiment is OFF, at locations where the secondary cosmic ray neutrons enter, an occurrence of avalanche breakdown due to charge generated due to secondary cosmic ray neutrons may be suppressed.

Figure 5:
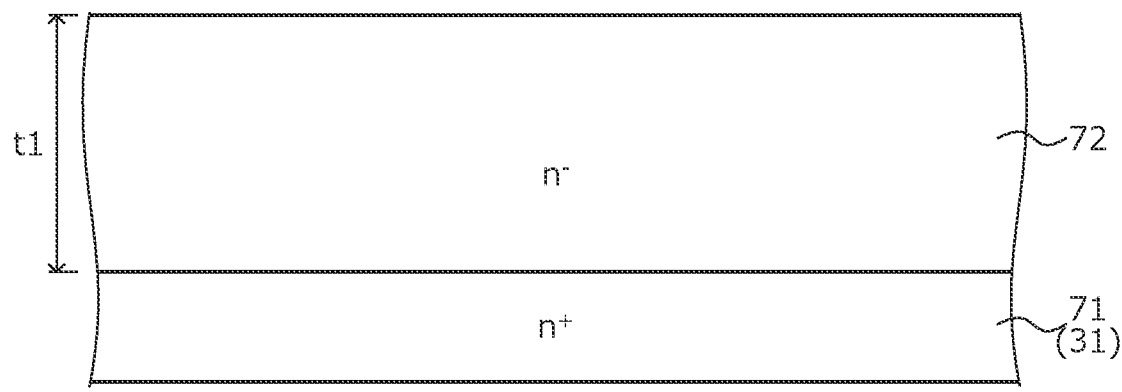
FIG. 5 is a cross-sectional view of the semiconductor device according to the first embodiment during manufacture.

Next, a method of manufacturing the semiconductor device 20 according to the first embodiment is described. FIGS. 5, 6, 7, 8, 9, and 10 are cross-sectional views of the semiconductor device according to the first embodiment during manufacture. In FIGS. 5 to 10, while only the main semiconductor device element 11 is depicted, parts of all of the element devices fabricated on the single semiconductor substrate 10, for example, are formed concurrently with corresponding parts of the main semiconductor device element 11. First, as depicted in FIG. 5, the n⁺-type starting substrate (semiconductor wafer) 71 containing silicon carbide is prepared.

The n⁺-type starting substrate 71, for example, may be a silicon carbide single crystal substrate doped with nitrogen (N). Next, on the front surface of the n⁺-type starting substrate 71, the n⁻-type silicon carbide layer 72 doped with a lower concentration of nitrogen than is the n⁺-type starting substrate 71 is formed by epitaxial growth. In an instance in which the main semiconductor device element 11 has a breakdown voltage of 3300V, a thickness t1 of the n⁻-type silicon carbide layer 72, for example, may be about 30 μm.

Figure 6:
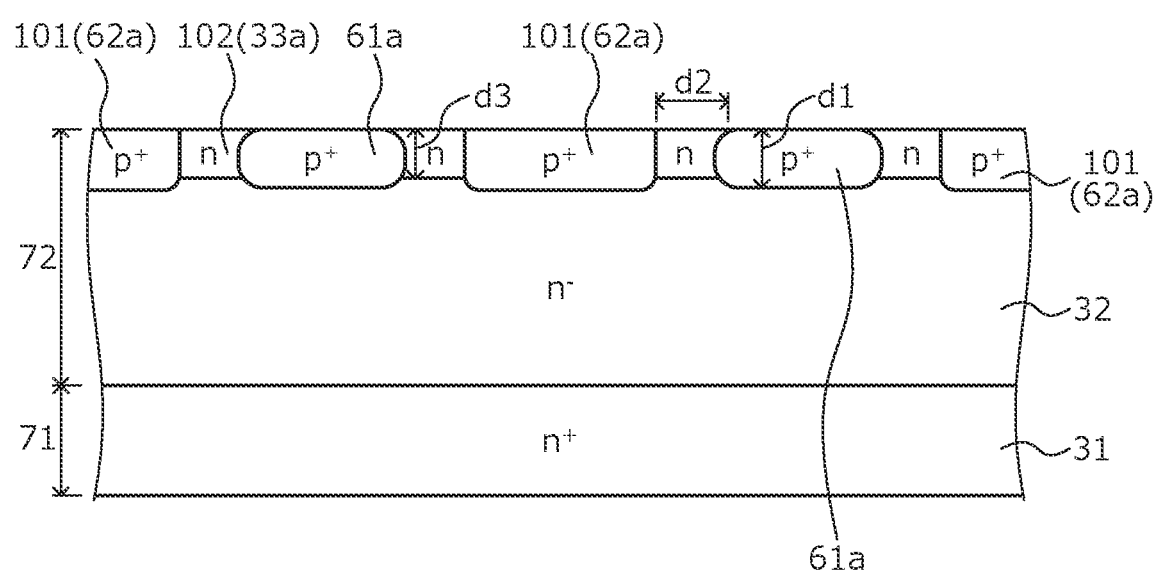
FIG. 6 is a cross-sectional view of the semiconductor device according to the first embodiment during manufacture.

Next, as depicted in FIG. 6, in the main effective region 1a, the first p⁺-type regions 61a and p⁺-type regions 101 are selectively formed in surface regions of the n⁻-type silicon carbide layer 72 by photolithography and, for example, ion implantation of a p-type impurity such as Al. The first p⁺-type regions 61a and the p⁺-type regions 101, for example, are disposed to repeatedly alternate one another in the first direction X (refer to FIGS. 2 to 4, viewing direction therein) and extend in a striped pattern in the second direction Y (refer to FIGS. 2 to 4, horizontal direction therein).

Next, spanning an entire area of the main effective region 1a, n-type regions 102 are formed in surface regions of the n⁻-type silicon carbide layer 72 by photolithography and, for example, ion implantation of an n-type impurity such as nitrogen. Each of the n-type regions 102 is formed between one of the first p⁺-type regions 61a and one of the p⁺-type regions 101 adjacent thereto and is in contact with each of these p⁺-type regions 61a, 101. A sequence in which the n-type regions 102 and the p⁺-type regions 61a, 101 are formed may be interchanged.

A distance d2 between each of the p⁺-type regions 61a and one of the p⁺-type regions 101 adjacent thereto, for example, is about 1.5 μm. The p⁺-type regions 61a, 101, for example, have a depth d1 and an impurity concentration that are about 0.5 μm and about $5.0 \times 10^{18}/cm^3$, respectively. The n-type regions 102 have a depth d3 and an impurity concentration that are, for example, about 0.4 μm and about $1.0 \times 10^{17}/cm^3$, respectively. Portions of the n⁻-type silicon carbide layer 72 free of ion implanted impurities form the n⁻-type drift region 32.

Figure 7:
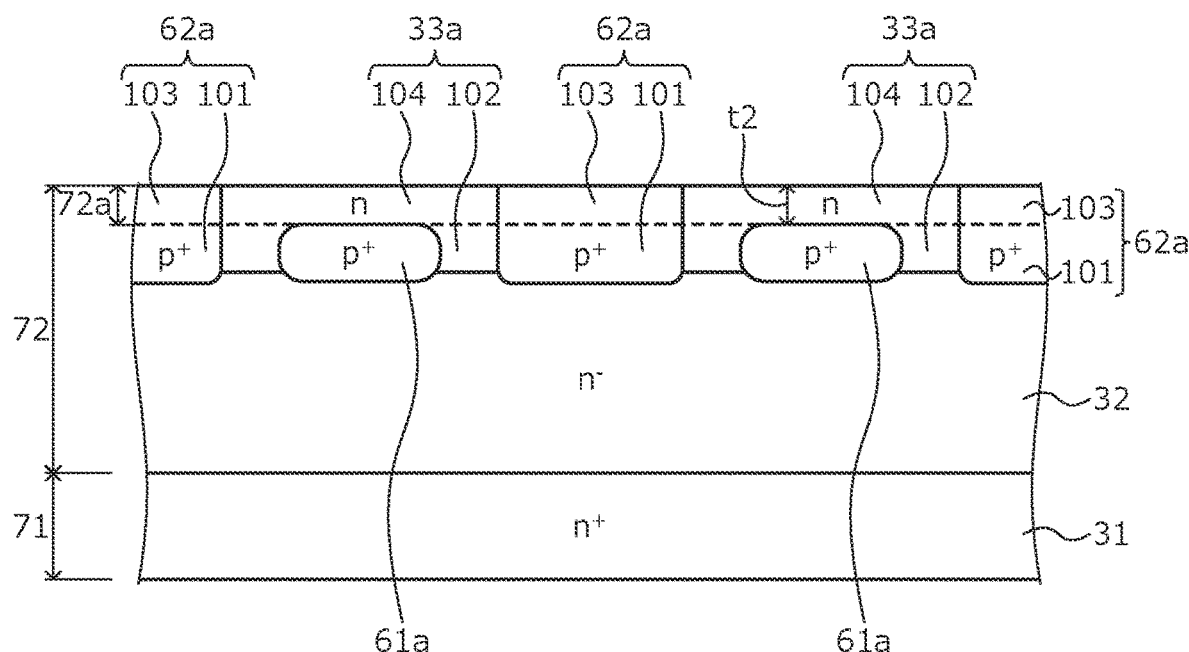
FIG. 7 is a cross-sectional view of the semiconductor device according to the first embodiment during manufacture.

Next, as depicted in FIG. 7, for example, an n⁻-type silicon carbide layer doped with an n-type impurity such as nitrogen is further formed on the n⁻-type silicon carbide layer 72 by epitaxial growth to have, for example, a thickness t2 of about 0.5 μm, thereby increasing a thickness of the n⁻-type silicon carbide layer 72. Next, in a portion 72a increasing the thickness of the n⁻-type silicon carbide layer 72, p⁺-type regions 103 that reach the p⁺-type regions 101 are selectively formed by photolithography and ion implantation of a p-type impurity such as Al.

Next, in the portion 72a increasing the thickness of the n⁻-type silicon carbide layer 72, n-type regions 104 that reach the n-type regions 102 are formed by photolithography and, for example, ion implantation of an n-type impurity such as nitrogen. Each of the p⁺-type regions 101 is connected with a corresponding one of the p⁺-type regions 103, whereby the second p⁺-type regions 62a are formed and each of the n-type regions 102 and a corresponding one of the n-type regions 104 are connected, whereby the n-type current spreading regions 33a are formed. A sequence in which the p⁺-type regions 103 and the n-type regions 104 are formed may be interchanged.

Figure 8:
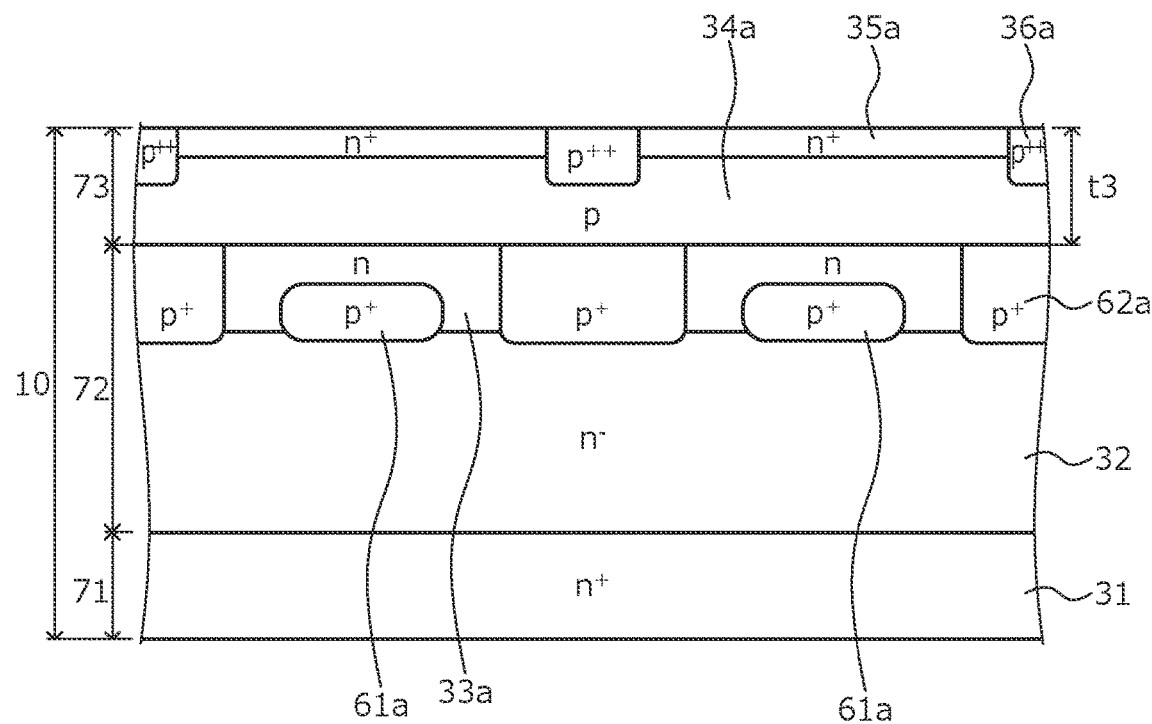
FIG. 8 is a cross-sectional view of the semiconductor device according to the first embodiment during manufacture.

Next, as depicted in FIG. 8, on the n⁻-type silicon carbide layer 72, for example, the p-type silicon carbide layer 73 doped with a p-type impurity such as Al is epitaxially grown. The p-type silicon carbide layer 73 has a thickness t3 and an impurity concentration that are, for example, about 1.3 μm and about $4.0 \times 10^{17}/cm^3$, respectively. By the processes up to here, the semiconductor substrate 10 (semiconductor wafer) in which the n⁻-type silicon carbide layer 72 and the p-type silicon carbide layer 73 are sequentially stacked on the n⁺-type starting substrate 71 is fabricated.

Next, for example, the p-type silicon carbide layer 73 is removed from an entire area of the edge termination region 2 by photolithography and etching. As a result, the drop 74 is formed at the front surface of the semiconductor substrate 10 and in the edge termination region 2, the second face 10b where the n⁻-type silicon carbide layer 72 is exposed and the third face 10c where the p-type silicon carbide layer 73 is exposed are formed at the front surface of the semiconductor substrate 10 (refer to FIG. 4). By this etching, a surface region of the n⁻-type silicon carbide layer 72 exposed at the second face 10b of the front surface of the semiconductor substrate 10 may be slightly removed.

Next, a process including photolithography and ion implantation as one set is repeatedly performed under different conditions, selectively forming the n⁺-type source regions 35a and the p⁺⁺-type contact regions 36a in surface regions of the p-type silicon carbide layer 73 in the main effective region 1a. In the main effective region 1a, portions of the p-type silicon carbide layer 73 between the n⁺-type source regions 35a, the p⁺⁺-type contact regions 36a, and the n⁻-type silicon carbide layer 72 form the p-type base regions 34a.

Further, a process including photolithography and ion implantation of a p-type impurity such as aluminum (Al) as one set is repeatedly performed under different conditions, selectively forming the p⁻-type regions 91 and the p⁻⁻⁻-type regions 92 in surface regions of the n⁻-type silicon carbide layer 72 in the edge termination region 2. Dose amounts of the p⁻-type regions 91 and the p⁻⁻⁻-type regions 92, for example, may be about $2.78 \times 10^{13}/cm^2$ and about $1.39 \times 10^{13}/cm^2$, respectively.

Next, a heat treatment (activation annealing) for activating impurities, for example, is performed at a temperature of about 1700 degrees C. for about 2 minutes with respect to diffused regions (the first and the second p⁺-type regions 61a, 62a, the n-type current spreading regions 33a, the n⁺-type source regions 35a, the p⁺⁺-type contact regions 36a, the p⁻-type regions 91, and the p⁻⁻⁻-type regions 92) formed by ion implantation. The activation annealing may be performed one time collectively for all of the diffused regions or may be performed each time diffused regions are formed by ion implantation.

Figure 9:
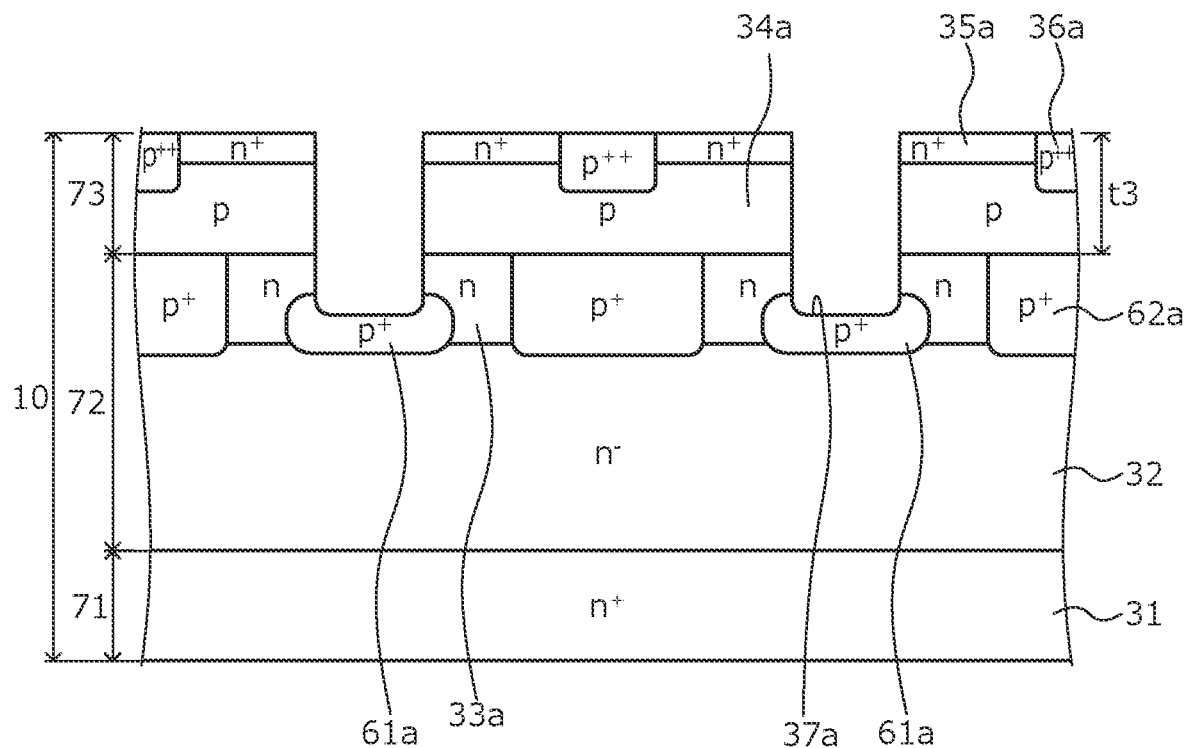
FIG. 9 is a cross-sectional view of the semiconductor device according to the first embodiment during manufacture.

Next, as depicted in FIG. 9, the trenches 37a that penetrate the n⁺-type source regions 35a and the p-type base regions 34a from the front surface of the semiconductor substrate 10 and reach the n-type current spreading regions 33a are formed by photolithography and etching to face the first p⁺-type regions 61a in the depth direction Z (refer to FIGS. 2 to 4, vertical direction therein), respectively. The trenches 37a, for example, may reach the first p⁺-type regions 61a and terminate in the first p⁺-type regions 61a, respectively.

Figure 10:
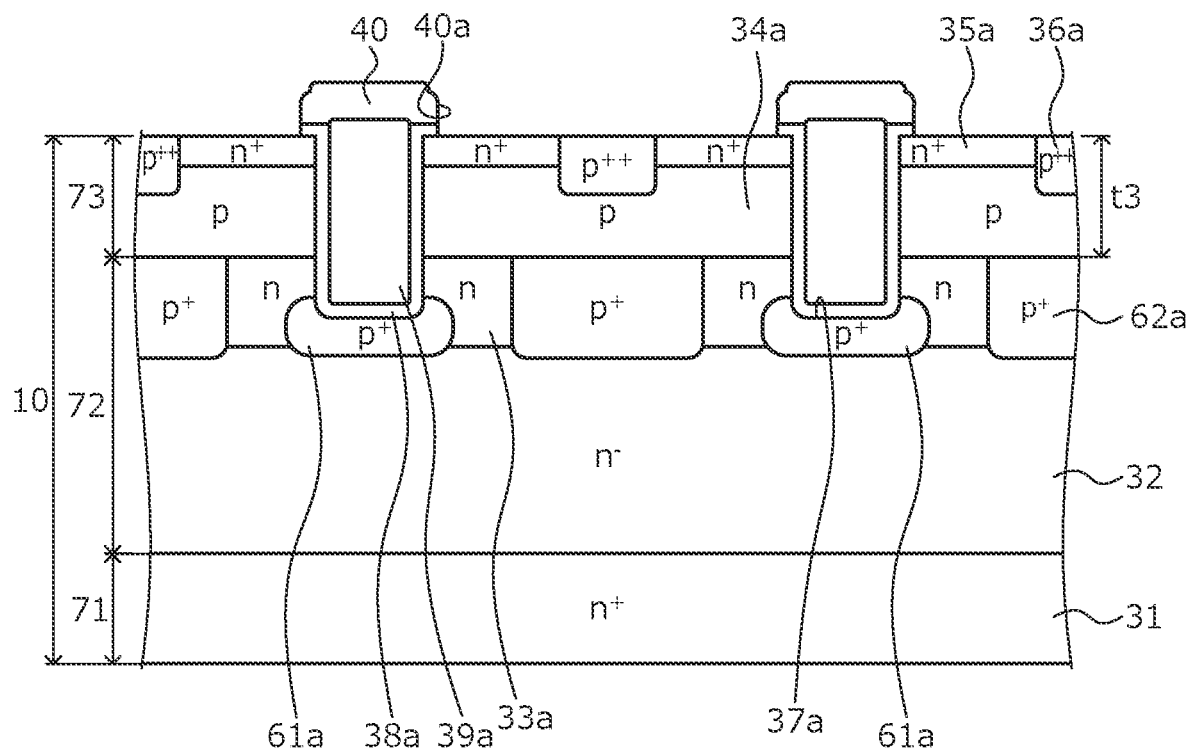
FIG. 10 is a cross-sectional view of the semiconductor device according to the first embodiment during manufacture.

Next, as depicted in FIG. 10, the gate insulating films 38a are formed along the front surface of the semiconductor substrate 10 and inner walls of the trenches 37a. The gate insulating films 38a, for example, may be a thermal oxide film formed by a temperature of about 1000 degrees in an oxygen ($O_2$) atmosphere or may be a deposited high temperature oxide (HTO). Next, for example, a phosphorous-doped polysilicon layer is formed on the front surface of the semiconductor substrate 10 so as to be embedded in the trenches 37a.

Next, the polysilicon layer is selectively removed, leaving portions thereof that form the gate electrodes 39a in the trenches 37a. Further, as described above, when the main semiconductor device element 11 is formed, parts of all of the device elements (high-function portions such as the current sensing portion 12, the temperature sensing portion 13, etc., refer to FIGS. 2 and 3) fabricated on the semiconductor substrate 10 and parts of the intermediate region 3 (the outermost p⁺-type region 83, the p-type base region 84, and the p⁺⁺-type contact region 85, refer to FIG. 4) are formed concurrently with parts of the main semiconductor device element 11 having an impurity concentration and depth identical thereto.

Next, in the edge termination region 2 and the intermediate region 3, the field oxide film 52 is formed on the front surface of the semiconductor substrate 10. Next, the interlayer insulating film 40 is formed in an entire area of the front surface of the semiconductor substrate 10. The main semiconductor device element 11 is formed in the p-type base regions 34a having an island-like shape formed in the semiconductor substrate 10 at the front surface thereof. As a result, by pn junction isolation by pn junctions between the p-type base regions 34a and the n⁻-type drift region 32, the main semiconductor device element 11 is isolated from all of the other device elements fabricated on the semiconductor substrate 10.

The current sensing portion 12, by a structure similar to that of the main semiconductor device element 11, may be disposed in the p-type base region 34b having an island-like shape formed in the semiconductor substrate 10 at the front surface thereof. As for the temperature sensing portion 13, on the interlayer insulating film 40, a polysilicon diode is formed by an pn junction between the p-type polysilicon layer 75 and the n-type polysilicon layer 76 (refer to FIG. 3), the polysilicon diode being covered by the interlayer insulating film 77. The gate polysilicon wiring layer 81 of the intermediate region 3, for example, suffices to be formed concurrently with the gate electrodes 39a of the main semiconductor device element 11.

Next, the interlayer insulating film 40 and the gate insulating films 38a are selectively removed, thereby forming the first to the fifth contact holes 40a, 40b, 77a, 77b, 40c. In the first contact holes 40a, the n⁺-type source regions 35a and the p⁺⁺-type contact regions 36a of the main semiconductor device element 11 are exposed. In the second contact holes 40b, the n⁺-type source regions 35b and the p⁺⁺-type contact regions 36b of the current sensing portion 12 are exposed. In the third to the fifth contact holes 77a, 77b, 40c, the p-type polysilicon layer 75, the n-type polysilicon layer 76, and the gate polysilicon wiring layer 81 are respectively exposed.

Next, the interlayer insulating films 40, 77 are planarized by a heat treatment (reflow). Next, the first TiN film 42a covering only the interlayer insulating film 40 is formed. Next, the NiSi films 41a in ohmic contact with portions of the front surface of the semiconductor substrate 10 exposed in the first contact holes 40a are formed. Next, on the front surface of the semiconductor substrate 10, the first Ti film 43a, the second TiN film 44a, and the second Ti film 45a are sequentially stacked so as to cover the NiSi films 41a and the first TiN film 42a, whereby the barrier metal 46a is formed. Next, the source pad 21a is deposited on the second Ti film 45a.

Further, in the second contact holes 40b, the NiSi films 41b and the barrier metal 46b are formed concurrently with the NiSi films 41a and the barrier metal 46a formed in the first contact holes 40a, the NiSi films 41b and the barrier metal 46b having configurations similar to those of the NiSi films 41a and the barrier metal 46a, respectively. Further, the OC pad 22, the anode pad 23a, the cathode pad 23b, and the gate metal wiring layer 82 are formed in the second to the fifth contact holes 40b, 77a, 77b, 40c concurrently with the source pad 21a, each having a configuration similar to that of the source pad 21a. Next, the drain electrode 51 in ohmic contact with the back surface of the semiconductor substrate 10 is formed and on the surface of the drain electrode 51, for example, a Ti film, an Ni film, and a gold (Au) film are sequentially stacked, whereby the drain pad (not depicted) is formed.

Next, the lifetime killer regions 95 (refer to FIG. 4) are selectively formed at predetermined positions in the n⁻-type drift region 32 by helium irradiation or proton irradiation from the front surface of the semiconductor substrate 10. At this time, a general shielding film is used for shielding so that helium or protons do not enter regions in which the lifetime killer regions 95 are not to be formed. The helium irradiation or proton irradiation is performed in multiple stages using shielding films having different opening patterns, whereby the lifetime killer regions 95 are formed at predetermined positions in the n⁻-type drift region 32. An irradiation dose of the helium irradiation or proton irradiation, for example, is in a range from about $1\times10^{11}$/cm to $1\times10^{15}$/cm² and determined suitably with consideration of a tradeoff relationship with leak current characteristics.

Next, the first protective films 49a to 49c containing a polyimide are selectively formed on the front surface of the semiconductor substrate 10 and in openings of the first protective films 49a to 49c, the various electrode pads 21a, 21b, 22, 23a, 23b are exposed. Next, after a general plating pretreatment, the plating films 47a to 47d are formed on the portions of the electrode pads 21a, 21b, 22, 23a, 23b exposed in the openings of the first protective films 49a to 49c, by a general plating process. Next, a heat treatment (baking) for drying the plating films 47a to 47d is performed.

Next, the second protective films 50a to 50c containing a polyimide are formed, covering borders between the plating films 47a to 47d and the first protective films 49a to 49c. Next, a heat treatment (curing) for enhancing the strength of the polyimide films (the first protective films 49a to 49c and the second protective films 50a to 50c) is performed. Next, the terminal pins 48a to 48d are bonded on the plating films 47a to 47d, respectively, by solder layers.

Next, for example, silicon nitride film is formed as the passivation film 53 by, for example, a plasma-enhanced chemical vapor deposition (plasma CVD) method. Thereafter, the semiconductor substrate 10 (semiconductor wafer) is diced (cut) into individual chips, whereby the semiconductor device 20 depicted in FIGS. 1 to 4 is completed.

As described above, according to the first embodiment, in the n⁻-type drift region in which a depletion layer spreads when the main semiconductor device element is OFF, the lifetime killer regions in which recombination centers that trap positive holes are introduced are formed spanning the active region to the edge termination region by helium irradiation or proton irradiation. As a result, before charge generated due to secondary cosmic ray neutrons when the main semiconductor device element is OFF occurs over a wide range of the n⁻-type drift region, the charge may be trapped by the recombination centers in the lifetime killer region, recombined and extinguished.

Therefore, even when secondary cosmic ray neutrons enter the semiconductor substrate when the main semiconductor device element is OFF and positive hole current (hereinafter, avalanche current) flows from the edge termination region toward the active region and is pulled out by the source pad, increase of the avalanche current by the charge generated due to the secondary cosmic ray neutrons may be suppressed. As a result, cosmic ray destruction resistance may be enhanced and occurrence of avalanche breakdown by the charge generated due to secondary cosmic ray neutrons may be suppressed.

Figure 11:
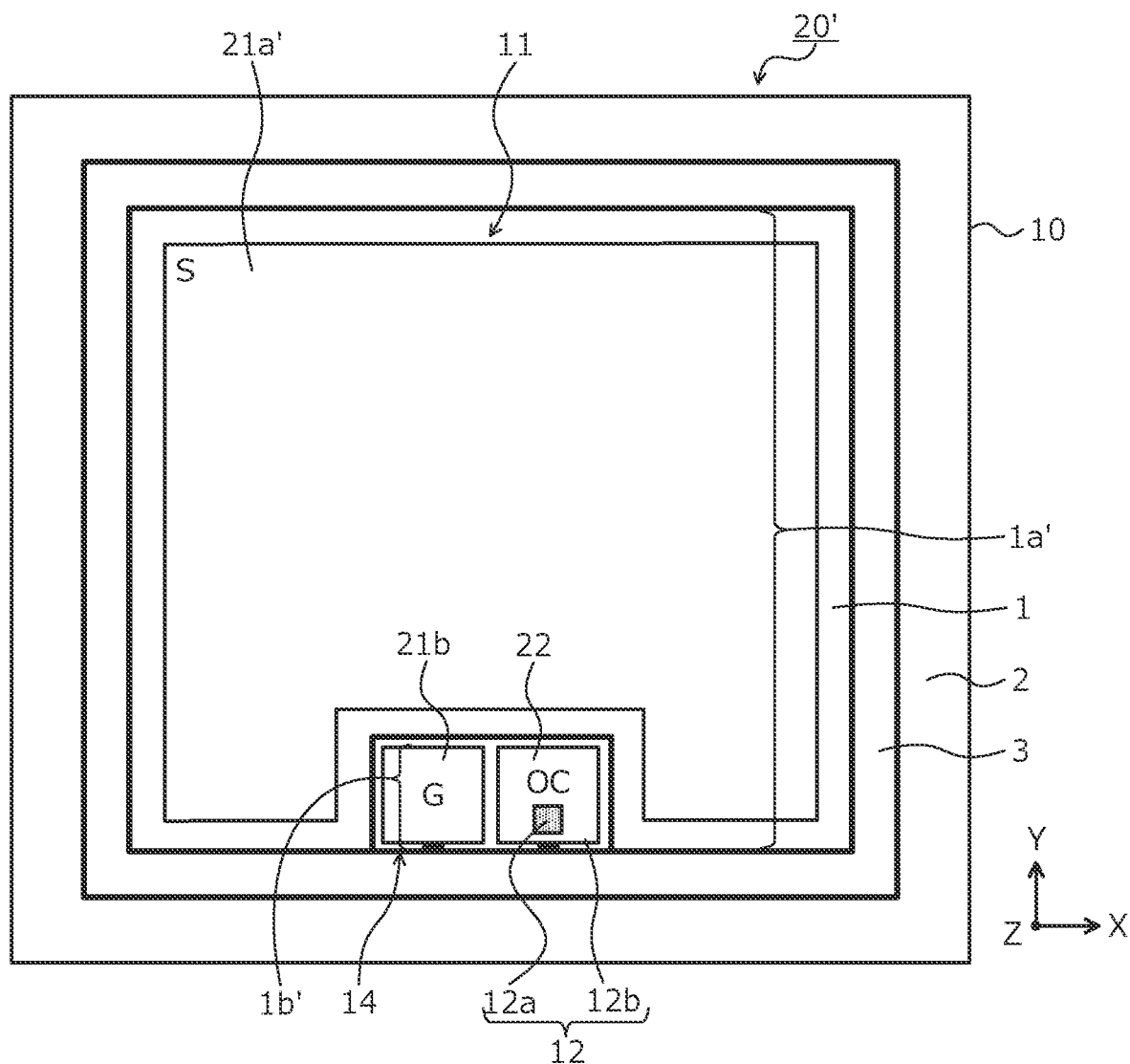
FIG. 11 is a plan view of a layout of a semiconductor device according to a second embodiment when viewed from the front side of the semiconductor substrate.
Figure 12:
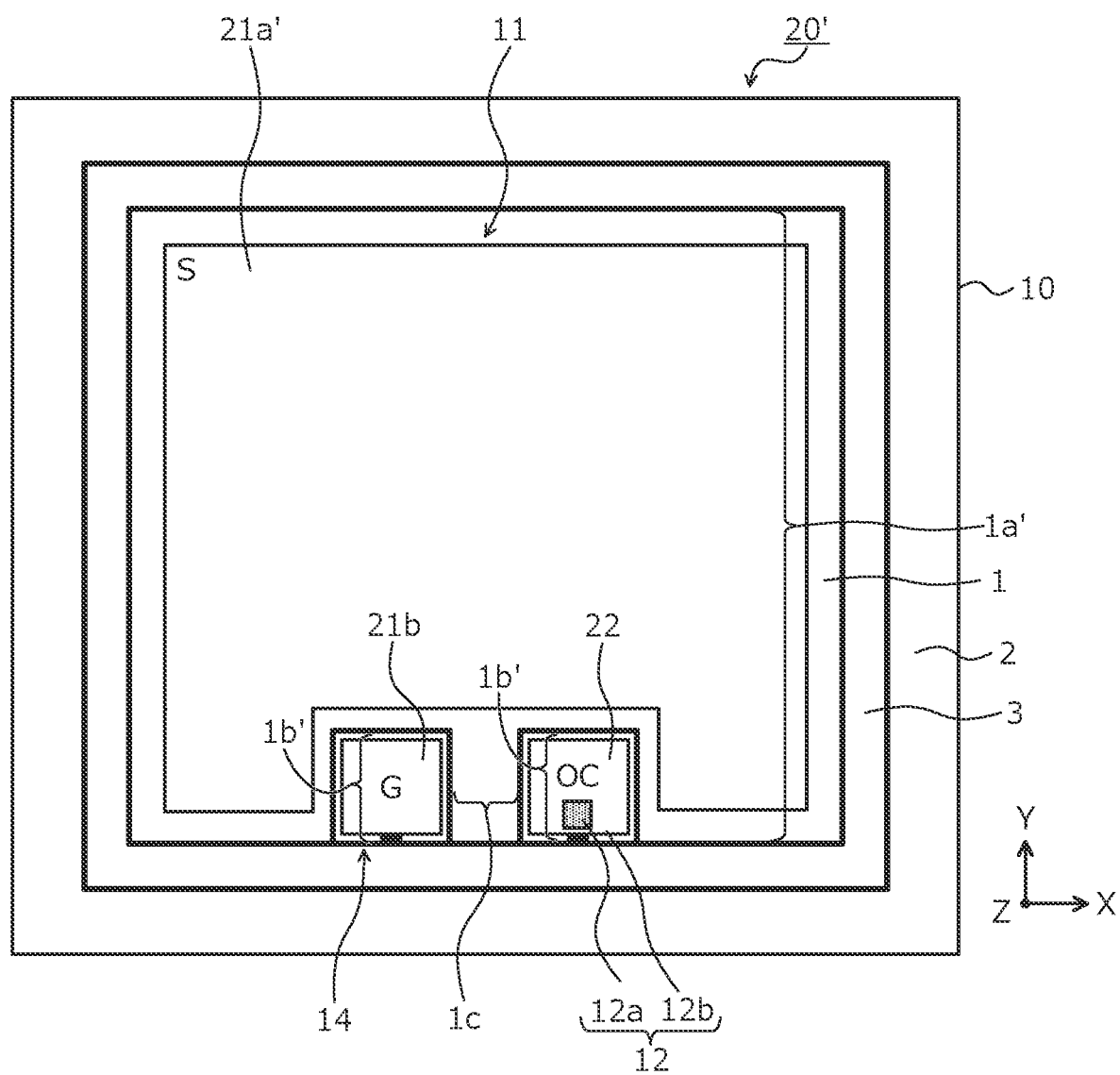
FIG. 12 is a plan view of a layout of a semiconductor device according to a second embodiment when viewed from the front side of the semiconductor substrate.

Next, a semiconductor device according to a second embodiment is described. FIGS. 11 and 12 are plan views of layouts of the semiconductor device according to the second embodiment when viewed from the front side of the semiconductor substrate. A semiconductor device 20' according to the second embodiment depicted in FIG. 11 differs from the semiconductor device 20 according to the first embodiment (refer to FIGS. 1 to 4) in that in the active region 1 of the single semiconductor substrate 10, only the main semiconductor device element 11 and the current sensing portion 12 are included.

In the second embodiment, in the main non-operating region 1b, only the gate pad 21b and the OC pad 22 are disposed. Therefore, in the semiconductor substrate 10 having the main semiconductor device element 11, a surface area of the main non-operating region 1b becomes smaller as compared to an instance in which high-function portions other than the current sensing portion 12 are disposed together with the current sensing portion 12 as a circuit portion for protecting and controlling the main semiconductor device element 11.

The main non-operating region 1b' in which the gate pad 21b is disposed and the main non-operating region 1b' in which the OC pad 22 is disposed may be disposed apart from one another (FIG. 12).

As described above, according to the second embodiment, in the active region of the single semiconductor substrate, even when only the main semiconductor device element and the current sensing portion are provided, effects similar to those of the first embodiment may be obtained.

Figure 13:
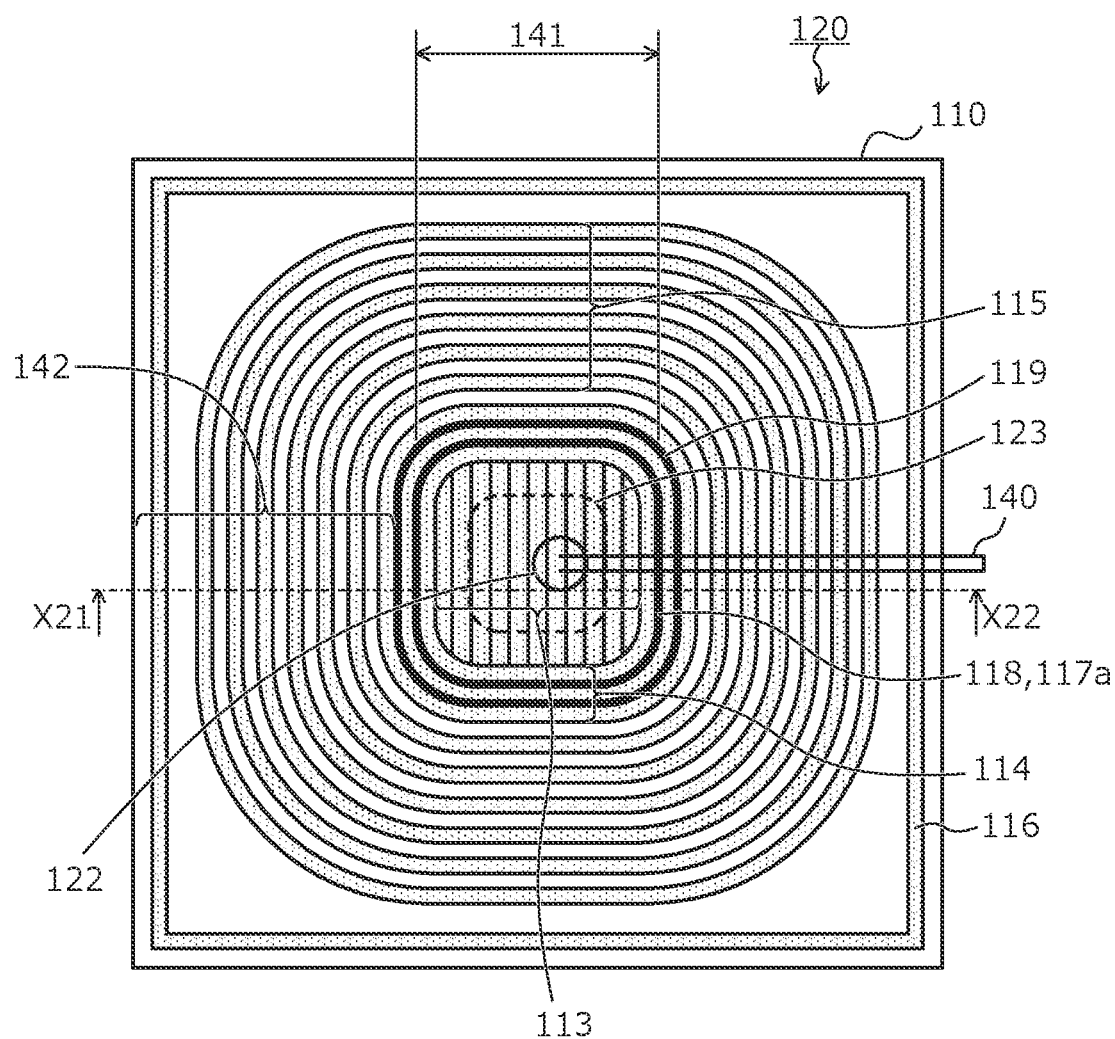
FIG. 13 is a plan view of a layout of a semiconductor device according to a third embodiment when viewed from the front side of the semiconductor substrate.
Figure 14:
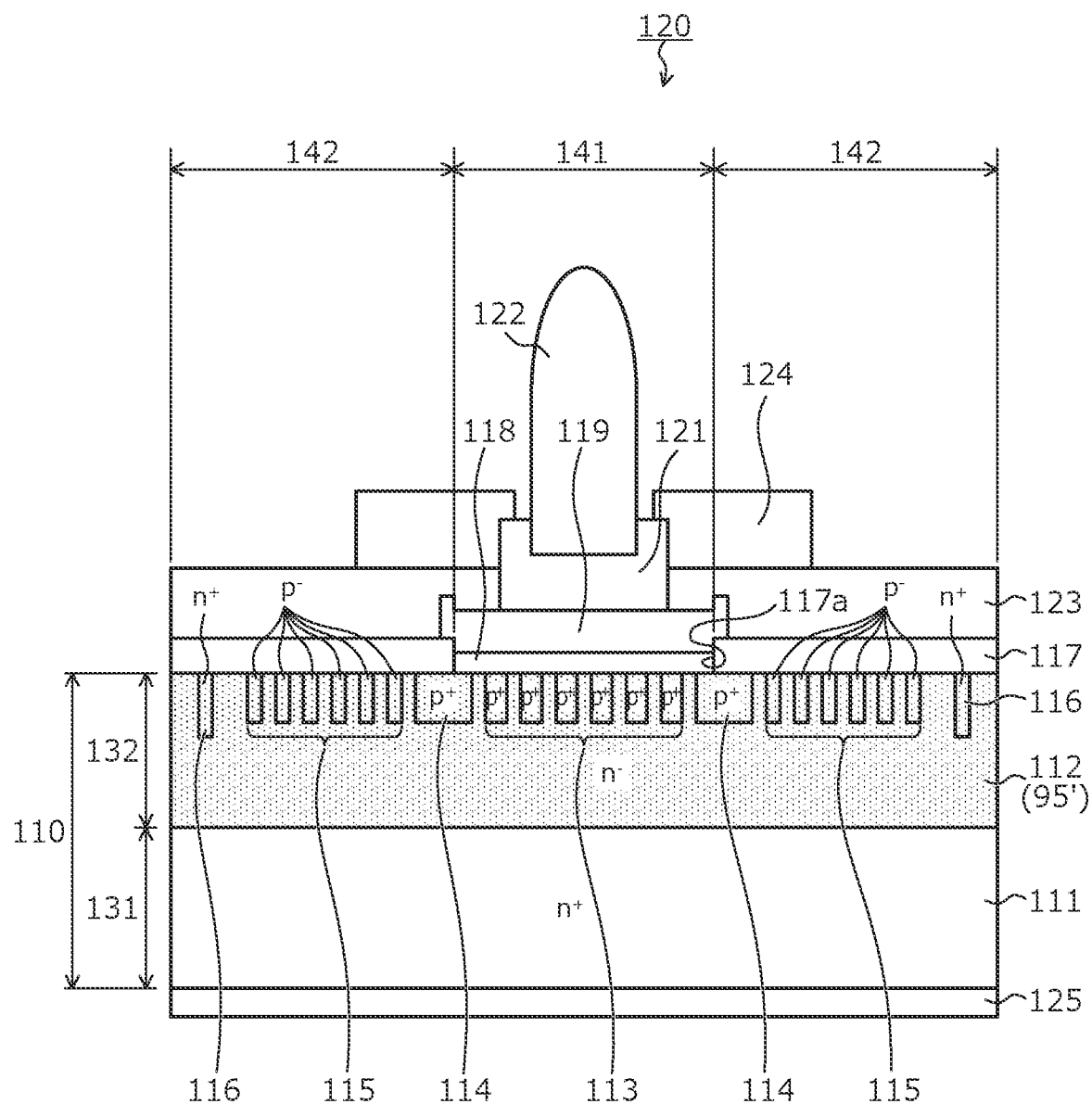
FIG. 14 is a cross-sectional view of a structure along cutting line X21-X22 in FIG. 13.

Next, a semiconductor device according to a third embodiment is described. FIG. 13 is a plan view of a layout of the semiconductor device according to the third embodiment when viewed from the front side of the semiconductor substrate. FIG. 14 is a cross-sectional view of a structure along cutting line X21-X22 in FIG. 13. A semiconductor device 120 according to the third embodiment is an SBD that includes a junction barrier Schottky (JBS) structure to which the configuration of the semiconductor device 20 according to the first embodiment is applied.

As depicted in FIG. 13, the semiconductor device 120 according to the third embodiment, in an active region 141, the JBS structure is included on a front side of a semiconductor substrate (semiconductor chip) 110. The active region 141 is provided in substantially a center (chip center) of the semiconductor substrate 110. The semiconductor substrate 110 is formed by epitaxially growing an n⁻-type silicon carbide layer 132 that forms an n⁻-type drift region 112, on a front surface of an n⁺-type starting substrate 131 containing silicon carbide.

The n⁺-type starting substrate 131 forms an n⁺-type cathode region 111. A main surface of the semiconductor substrate 110 on a side thereof having the n⁻-type silicon carbide layer 132 is a front surface and a main surface of the semiconductor substrate 110 on a side thereof having the n⁺-type starting substrate 131 is a back surface (back surface of the n⁺-type starting substrate 131). A region between the active region 141 and ends (chip ends) of the semiconductor substrate 110 is an edge termination region 142. The edge termination region 142 is provided adjacent to the active region 141 and surrounds a periphery of the active region 141.

In the active region 141, in surface regions of the semiconductor substrate 110 at the front surface thereof, multiple p⁺-type regions 113 configuring the JBS structure are selectively provided in the n⁻-type silicon carbide layer 132. The p⁺-type regions 113, for example, may extend in a striped pattern in a direction parallel to the front surface of the semiconductor substrate 110 (FIG. 13) or may be disposed in a lattice-like shape (not depicted), when viewed from the front side of the semiconductor substrate 110. A width of the p⁺-type regions 113, for example, is about 2 μm and a distance between adjacent p⁺-type regions 113 of the p⁺-type regions 113 may be about 3 μm.

At a border between the active region 141 and the edge termination region 142, in surface regions of the semiconductor substrate 110 at the front surface thereof, p⁺-type regions 114 are selectively provided in the n⁻-type silicon carbide layer 132, separate from the p⁺-type regions 113. The p⁺-type regions 114 surround a periphery of the active region 141, for example, in a substantially rectangular shape having rounded corners, a plan view thereof. The p⁺-type regions 114 and later-described p⁻-type regions 115 are disposed so that adjacent regions thereof have equal intervals therebetween.

In the edge termination region 142, in surface regions of the semiconductor substrate 110 at the front surface thereof, the p⁻-type regions 115 and n⁺-type channel stopper regions 116 are selectively provided in the n⁻-type silicon carbide layer 132. The p⁻-type regions 115 are provided separate from the p⁺-type regions 114. With the active region 141 as a center, the p⁻-type regions 115 surround a periphery of the p⁺-type regions 114, for example, in a substantially rectangular shape having rounded corners and configure FLRs.

The n⁺-type channel stopper regions 116 are provided closer to the chip ends than are the p⁻-type regions 115, separate from the p⁻-type regions 115. In a substantially rectangular shape, the n⁺-type channel stopper regions 116 surround an entire area of the device element structure (the p⁺-type regions 113, the p⁺-type regions 114, and the p⁻-type regions 115) closer to the chip center than are the n⁺-type channel stopper regions 116, along the ends of the semiconductor substrate 110 having a substantially rectangular shape in a plan view thereof.

Portions of the n⁻-type silicon carbide layer 132 between the n⁺-type cathode region 111 and the p⁺-type regions 113, the p⁺-type regions 114 and the p⁻-type regions 115 are the n⁻-type drift region 112. In an entire area of the n⁻-type drift region 112, the recombination centers that trap positive holes are introduced, whereby the lifetime killer regions 95' in which the lifetime of minority carriers (holes) is shortened (hatched portion in FIG. 14) are provided.

The lifetime killer regions 95' need not be provided in surface portions of the n⁻-type drift region 112, the p⁺-type regions 113, and the p⁺-type regions 114 at respective surfaces thereof in contact with a Schottky electrode 118. In doing so, increase of the leak current due to the introduction of the lifetime killers may be suppressed. The surface portions are in a range at most about 1 μm from about the surface (interface between the Schottky electrode 118 and the semiconductor substrate 110). The lifetime killer regions 95', similarly to the first embodiment, are formed by helium irradiation or proton irradiation.

An interlayer insulating film 117 covers an entire area of the front surface of the semiconductor substrate 110 in the edge termination region 142. In a contact hole 117a of the interlayer insulating film 117, an entire area of the front surface of the semiconductor substrate 110 in the active region 141 is exposed. At the front surface of the semiconductor substrate 110 in the active region 141, the p⁺-type regions 113 and a portion of each of the p⁺-type regions 114a re exposed. Being exposed at the front surface of the semiconductor substrate 110 is being in contact with the later-described Schottky electrode 118 in the contact hole 117a of the interlayer insulating film 117.

The Schottky electrode 118 is provided in an entire area of the front surface of the semiconductor substrate 110 in the contact hole 117a of the interlayer insulating film 117. The Schottky electrode 118, for example, is formed by sequentially stacking a titanium silicide (TiSi) film and a titanium carbide (TiC) film. The Schottky electrode 118 is in contact with the n⁻-type drift region 112, the p⁺-type regions 113, and the p⁺-type regions 114, and is electrically connected to these regions. The Schottky electrode 118 forms a Schottky contact with the n⁻-type drift region 112 and functions as an anode electrode.

The Schottky electrode 118, for example, has a substantially rectangular shape having rounded corners (vertex portions), in a plan view thereof. Rounding of the corners of the Schottky electrode 118 enables suppression of electric field concentration at the corners of the Schottky electrode 118. The Schottky electrode 118, for example, may have a square shape having rounded corners with a radius of curvature of about 150 μm. Ends of the Schottky electrode 118, for example, cover the p⁺-type regions 114 by a width of 4 μm.

On the Schottky electrode 118, an anode pad 119 is provided. The anode pad 119, for example, is formed using a same material as that of the source pad 21a of the first embodiment (refer to FIG. 1). The anode pad 119 may extend onto the interlayer insulating film 117. On the anode pad 119, terminal pins 122 are bonded by a wiring structure similar to the wiring structure on the source pad 21a of the first embodiment. Reference numeral 140 is an external electrode bonded to the terminal pins 122.

The terminal pins 122 are external connection terminals that lead out electric potential of the anode pad 119. The terminal pins 122 are wiring members having a round, rod-like shape (cylinder shape) having a predetermined diameter corresponding to the current capability of the semiconductor device 120 (SBD) according to the third embodiment. Reference numerals 121, 123, and 124 are a plating film and first and second protective films configuring the wiring structure on the anode pad 119. A cathode pad 125 in ohmic contact with the n⁺-type starting substrate 131 is provided on a back surface the semiconductor substrate 110 (back surface of the n⁺-type starting substrate 131).

Next, operation of the semiconductor device 120 according to the third embodiment is described. The semiconductor device 120 according to the third embodiment, for example, is connected in parallel to a MOSFET configuring a general inverter, regenerates or interrupts backward current during switching (ON/OFF) of the MOSFET and is used as a FWD that protects the MOSFET. For example, the main semiconductor device element 11 of the semiconductor device 20 according to the first embodiment is used for the MOSFET.

The semiconductor device 120 according to the third embodiment (SBD) and the MOSFET configuring the inverter perform switching under conditions of high voltage and large current during operation of the inverter. In the semiconductor device 120 according to the third embodiment, during forward bias when voltage that is positive with respect to a cathode electrode (the cathode pad 125) is applied to the anode electrode (the anode pad 119), forward current flows from the p⁺-type regions 113 to the n⁺-type cathode region 111.

On the other hand, in the semiconductor device 120 according to the third embodiment, during reverse bias when voltage that is negative with respect to the cathode electrode (the cathode pad 125) is applied to the anode electrode (the anode pad 119), a depletion layer spreads in the p⁺-type regions 113 and the n⁻-type drift region 112 from pn junctions between the p⁺-type regions 113 and the n⁻-type drift region 112, and reverse current flows from the n⁺-type cathode region 111 to the p⁺-type regions 113.

During reverse bias, even when secondary cosmic ray neutrons of high energy enter the semiconductor substrate 110, similarly to the first embodiment, charge (hole-electron pairs (e⁺e⁻)) may be recombined and extinguished by the recombination centers introduced into the n⁻-type silicon carbide layer 132. The switching operation of the MOSFET configuring the inverter is similar to that of the main semiconductor device element 11 of the semiconductor device 20 according to the first embodiment.

Next, a method of manufacturing the semiconductor device 120 according to the third embodiment is described. FIGS. 15, 16, 17, and 18 are cross-sectional views of the semiconductor device according to the third embodiment during manufacture.

Figure 15:
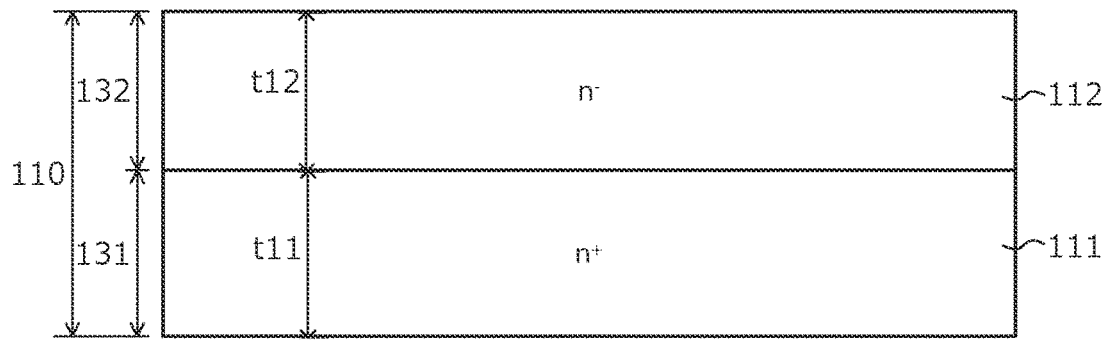
FIG. 15 is a cross-sectional view of the semiconductor device according to the third embodiment during manufacture.

First, as depicted in FIG. 15, the n⁺-type starting substrate 131 containing silicon carbide is prepared. The n⁺-type starting substrate 131, for example, may be silicon carbide single crystal substrate doped with nitrogen. An impurity concentration and a thickness t11 of the n⁺-type starting substrate 131 may be, for example, about $1 \times 10^{18}/cm^3$ and about 300 μm, respectively. The front surface of the n⁺-type starting substrate 131, for example, may be a (0001) plane, a so-called Si face, or may be a (000-1) plane, a so-called C face.

Next, the n⁻-type silicon carbide layer 132 doped with a lower concentration of nitrogen than is the n⁺-type starting substrate 131 is epitaxially grown on the front surface of the n⁺-type starting substrate 131, whereby the semiconductor substrate (semiconductor wafer) 110 is fabricated. An impurity concentration and a thickness t12 of the n⁻-type silicon carbide layer 132, for example, may be about $1.8 \times 10^{16}/cm^3$ and about 6 μm, respectively. In FIGS. 14 to 18, the thickness t11 of the n$^+$-type starting substrate 131 and the thickness t12 of the n$^-$-type silicon carbide layer 132 are depicted having proportions different from actual proportions.

Figure 16:
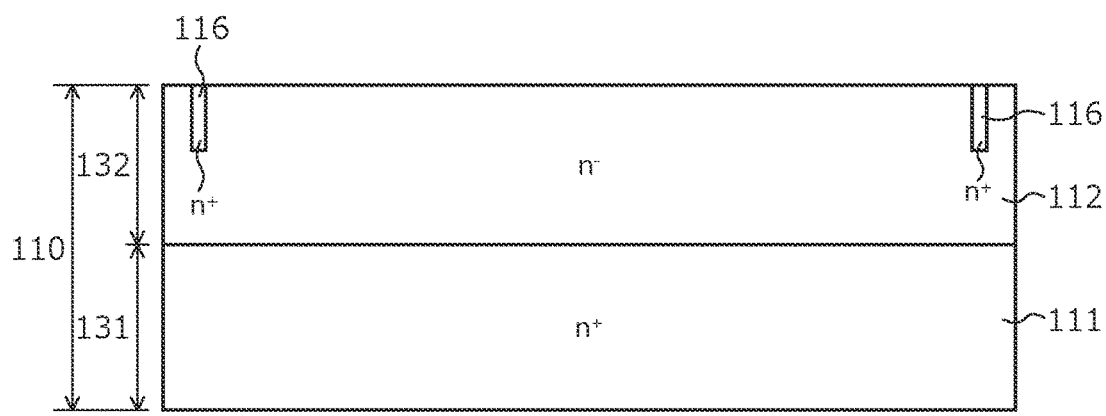
FIG. 16 is a cross-sectional view of the semiconductor device according to the third embodiment during manufacture.
Figure 17:
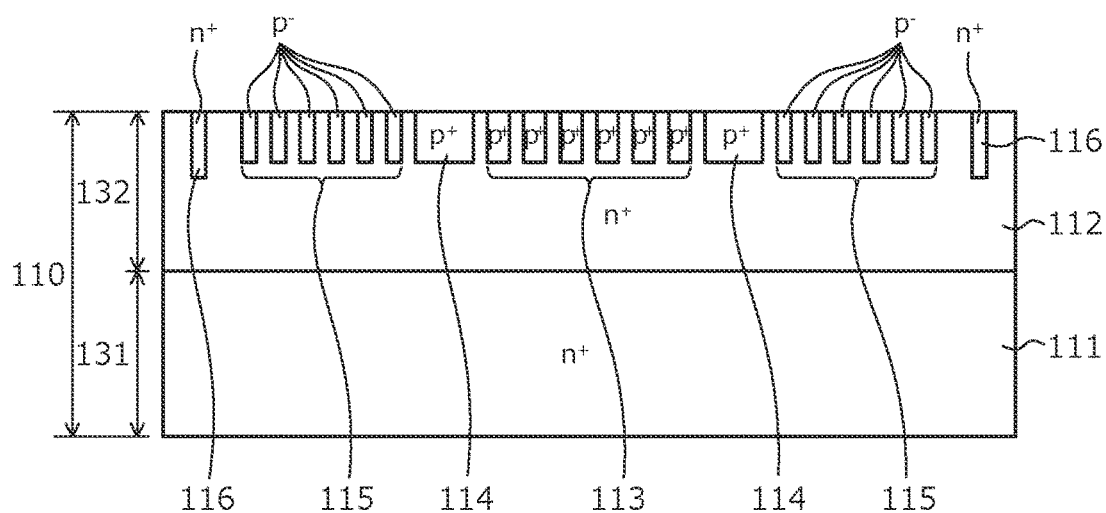
FIG. 17 is a cross-sectional view of the semiconductor device according to the third embodiment during manufacture.

Next, as depicted in FIG. 16, the n$^+$-type channel stopper regions 116 are selectively formed in surface regions of the n$^-$-type silicon carbide layer 132 in the edge termination region 142 by photolithography and ion implantation of an n-type impurity such as phosphorus (P). Next, as depicted in FIG. 17, by photolithography and ion implantation of a p-type impurity such as aluminum, the p$^+$-type regions 113, the p$^+$-type regions 114, and the p$^-$-type regions 115 are selectively formed in surface regions of the n$^-$-type silicon carbide layer 132 in the active region 141 and the edge termination region 142.

A sequence in which diffused regions (the p$^+$-type regions 113, the p$^+$-type regions 114, the p$^-$-type regions 115, and the n$^+$-type channel stopper regions 116) formed by ion implantation are formed may be interchanged. Next, a heat treatment (activation annealing) for activating impurities, for example, is performed at a temperature of about 1650 degrees C. for about 4 minutes with respect to the diffused regions formed by ion implantation. The activation annealing may be performed one time collectively for all of the diffused regions or may be performed each time diffused regions are formed by ion implantation.

Figure 18:
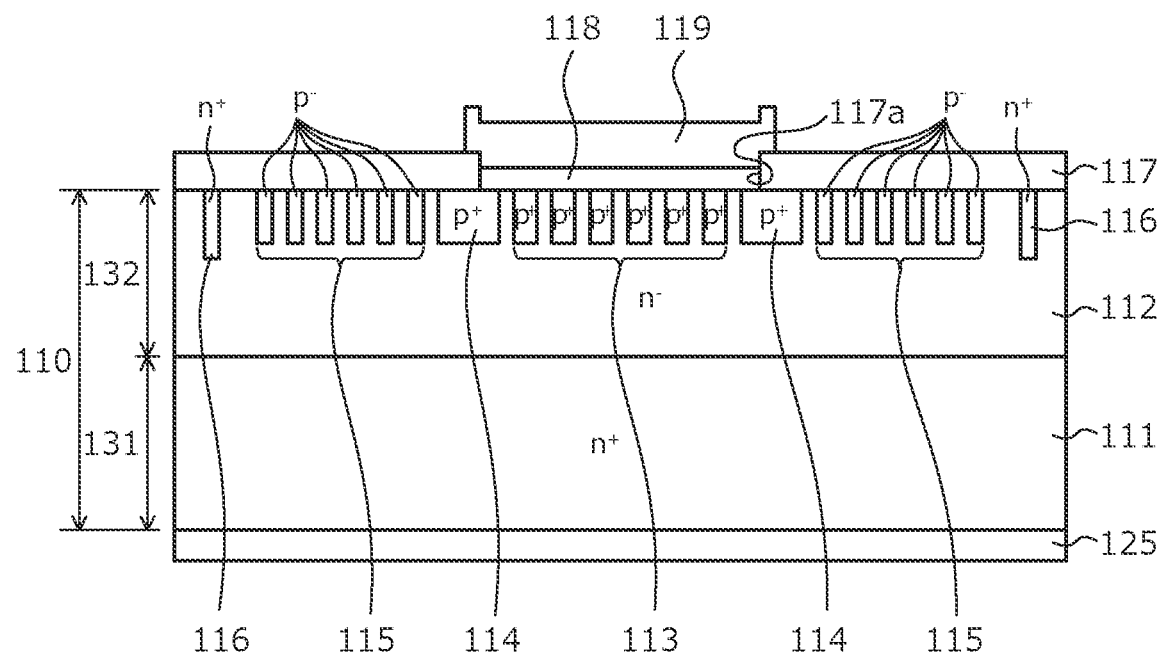
FIG. 18 is a cross-sectional view of the semiconductor device according to the third embodiment during manufacture.
Figure 19:
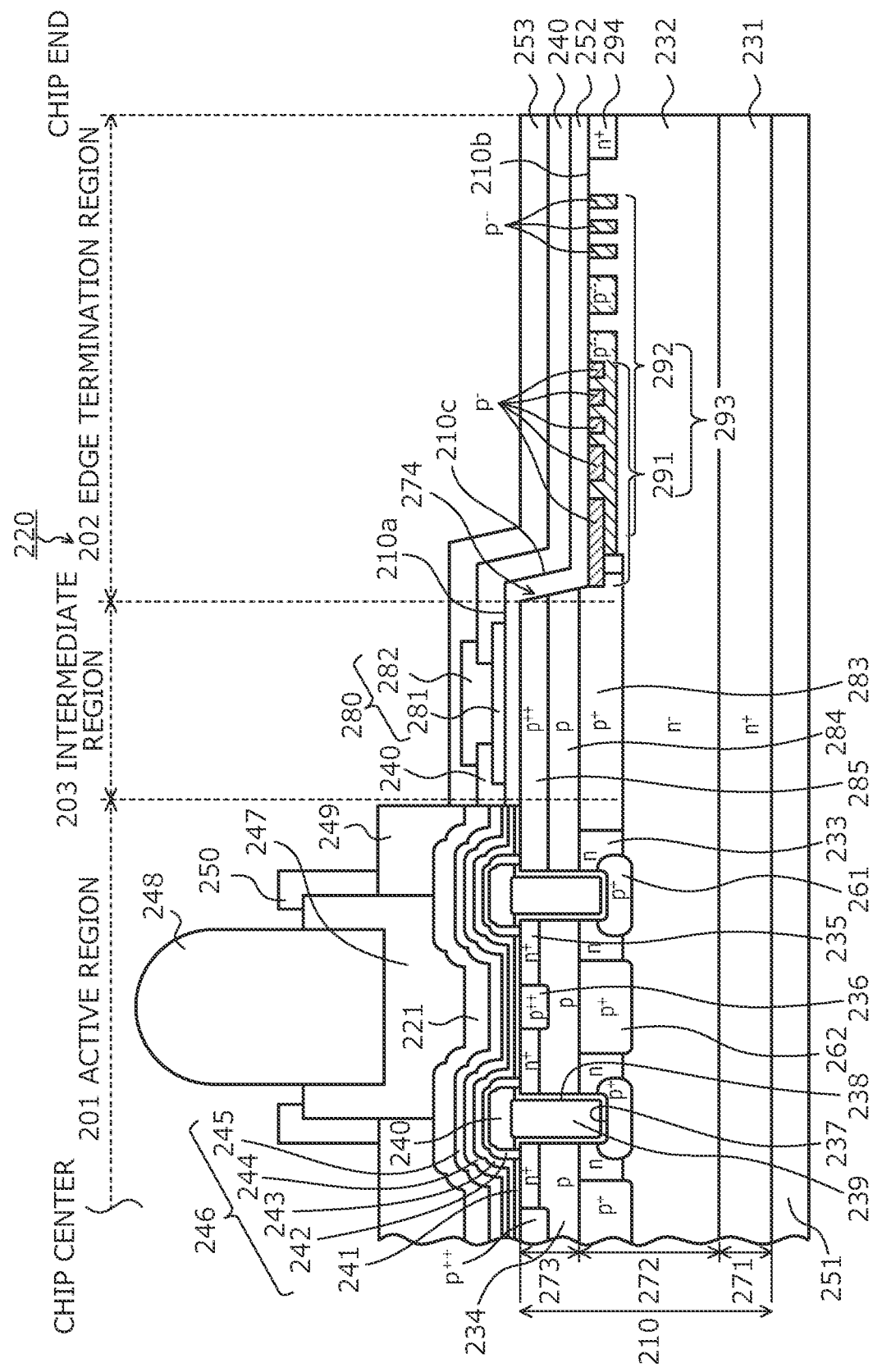
FIG. 19 is a cross-sectional view of a structure of a conventional semiconductor device.

Next, as depicted in FIG. 18, the interlayer insulating film 117 is formed in an entire area of the front surface of the semiconductor substrate 110. Next, the interlayer insulating film 117 is selectively removed, forming the contact hole 117a. An entire area of the front surface of the semiconductor substrate 110 in the active region 141 is exposed in the contact hole 117a. Next, the interlayer insulating film 117 is planarized by a heat treatment.

Next, the Schottky electrode 118 is formed so as to form a Schottky contact with a portion of the front surface of the semiconductor substrate 110 exposed in the contact hole 117a. The Schottky electrode 118, for example, is formed by performing a heat treatment at a temperature of about 500 degrees C. in an argon (Ar) atmosphere for about 5 minutes on a titanium layer deposited on the front surface of the semiconductor substrate 110, in vacuum atmosphere.

Next, the anode pad 119 is deposited on the Schottky electrode 118. Next, the cathode electrode (the cathode pad 125) is formed in ohmic contact with the back surface of the semiconductor substrate 110, and on the surface of the cathode electrode, for example, a Ti film, a Ni film, and a gold film are sequentially stacked are stacked thereby forming a drain pad (not depicted). Next, similarly to the first embodiment, the lifetime killer regions 95' are formed in an entire area of the n$^-$-type silicon carbide layer 132 by the helium irradiation or the proton irradiation from the front surface of the semiconductor substrate 110. At this time, the lifetime killer regions 95' need not be provided in an uppermost surface of the n$^-$-type silicon carbide layer 132. The uppermost surface is in a range at most 1 μm from the surface.

Next, the first protective films 123 containing a polyimide are selectively formed on the front surface of the semiconductor substrate 10, the anode pad 119 being exposed in openings of the first protective films 123. Next, a general plating pretreatment is performed. Next, by a general plating process, the plating film 121 is formed on portions of the anode pad 119 exposed in the openings of the first protective films 123 and subsequent processes of forming the second protective films 124, bonding the terminal pins 122, ad dicing (cutting) are performed similarly to the first embodiment, whereby the semiconductor device 120 depicted in FIGS. 13 and 14 is completed.

As described above, according to the third embodiment, during reverse bias, similarly to the first and the embodiments, charge generated due to secondary cosmic ray neutrons that enter the semiconductor substrate may be recombined by the impurity state in the n$^-$-type drift region and reduced. Therefore, even for an SBD in which the leak current is about 10 times greater compared to a MOSFET, avalanche current may be suppressed, electric field may be mitigated, and avalanche breakdown destruction may be suppressed.

In the foregoing, the present invention is not limited to the embodiments described above and various modifications within a range not departing from the spirit of the invention are possible. For example, the lifetime killer regions may be formed using an element such as platinum (Pt), gold (Au), vanadium (V), or the like. In this instance, these elements may be introduced during epitaxial growth of a silicon carbide layer not only during ion implantation.

Furthermore, a layer having a low lifetime may be provided in a portion of the silicon carbide layer and by injecting helium or protons into the edge termination region, the lifetime killer region may be exposed at the surface of the edge termination region. The present invention is applicable even in instances where, instead of silicon carbide as a semiconductor material, a wide bandgap semiconductor other than silicon carbide is used as a semiconductor material. Further, the present invention is similarly implemented even the conductivity types (n-type, p-type) are reversed.

According to the invention described above, with respect to avalanche current that flows from the edge termination region toward the active region and is pulled out by the first electrode when a vertical semiconductor device element is OFF, increase of the avalanche current by charge that is generated due to secondary cosmic ray neutrons may be suppressed. Therefore, the occurrence of avalanche breakdown due to secondary cosmic ray neutrons may be suppressed.

The semiconductor device according to the present invention achieves an effect in that cosmic ray destruction resistance may be enhanced.

In this manner, the semiconductor device according to the present invention is useful for power semiconductors that control high voltage and/or large current.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having, in a plan view thereof, an active region and a termination region that surrounds a periphery of the active region, the device comprising:
   a semiconductor substrate containing a wide bandgap semiconductor having a bandgap wider than that of silicon, the semiconductor substrate having a first main surface and a second main surface opposite to each other;
   a first-conductivity-type region provided in the semiconductor substrate, spanning from the active region to the termination region;

a plurality of second-conductivity-type regions provided in the semiconductor substrate, between the first-conductivity-type region and the first main surface of the semiconductor substrate and in the active region;

a first electrode provided on the first main surface of the semiconductor substrate and electrically connected to the second-conductivity-type regions;

a second electrode provided on the second main surface of the semiconductor substrate and electrically connected to the first-conductivity-type region; and a lifetime killer region in which a lifetime of minority carriers is shortened, the lifetime killer region being provided in the first-conductivity-type region and spanning from the active region to the termination region, wherein in the active region the first-conductivity-type region and the second-conductivity-type regions form a plurality of pn junctions therebetween, to thereby form a vertical semiconductor device element, current passing through the vertical semiconductor device element in a direction from the first main surface of the semiconductor substrate toward the second main surface thereof or in a direction from the second main surface of the semiconductor substrate toward the first main surface thereof, and the first electrode and the second electrode respectively form a first electrode and a second electrode of the vertical semiconductor device element; and the lifetime killer region is of an L-shape in a cross-sectional view of the semiconductor substrate, and extends to the first main surface of the semiconductor substrate in the termination region.

2. The semiconductor device according to claim 1, wherein the lifetime killer region, at the first main surface of the semiconductor substrate in the termination region, surrounds the periphery of the active region in the plan view.

3. The semiconductor device according to claim 1, wherein the lifetime killer region has a plurality of recombination centers therein caused by an impurity state of helium or protons in the bandgap of the wide bandgap semiconductor.

4. The semiconductor device according to claim 1, wherein the lifetime killer region includes a plurality of lifetime killer regions provided in a striped pattern extending in a direction parallel to the first main surface of the semiconductor substrate.

5. The semiconductor device according to claim 1, wherein the lifetime killer region is provided in an entire area of the first-conductivity-type region in the plan view.

6. The semiconductor device according to claim 1, wherein a depletion layer spreads in the first-conductivity-type region from the active region toward the termination region during reverse bias of the pn junctions.

7. he semiconductor device according to claim 1, further comprising a plurality of current spreading regions formed between the first-conductivity-type region and the second-conductivity-type regions, so as to cause a depletion layer to spread in the first-conductivity-type region from the active region toward the termination region during reverse bias of the pn junctions.

* * * * *